(12) United States Patent
Chen et al.

(10) Patent No.: US 9,343,393 B2
(45) Date of Patent: May 17, 2016

(54) SEMICONDUCTOR SUBSTRATE ASSEMBLY WITH EMBEDDED RESISTANCE ELEMENT

(71) Applicant: INDUSTRIAL TECHNOLOGY RESEARCH INSTITUTE, Hsinchu (TW)

(72) Inventors: Peng-Shu Chen, New Taipei (TW); Shih-Hsien Wu, Yangmei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 0 days.

(21) Appl. No.: 14/570,684

(22) Filed: Dec. 15, 2014

(65) Prior Publication Data

US 2015/0097298 A1    Apr. 9, 2015

Related U.S. Application Data

(63) Continuation-in-part of application No. 13/797,366, filed on Mar. 12, 2013, now Pat. No. 9,029,984.

(30) Foreign Application Priority Data

Aug. 15, 2012 (TW) .............................. 101129625 A
Jun. 20, 2014 (TW) .............................. 103121406 A

(51) Int. Cl.
*H01L 23/48* (2006.01)
*H01L 23/64* (2006.01)
(Continued)

(52) U.S. Cl.
CPC ........ *H01L 23/481* (2013.01); *H01L 21/02107* (2013.01); *H01L 23/49827* (2013.01);
(Continued)

(58) Field of Classification Search
CPC ....... H01L 29/92; H01L 21/02; H01L 21/768; H01L 23/481; H01L 23/5228; H01L 23/64; H01L 23/66; H01L 23/147; H01L 23/522

USPC .......................................................... 257/774
See application file for complete search history.

(56) References Cited

U.S. PATENT DOCUMENTS 7,200,010 B2    4/2007  Broman et al.
7,561,410 B1 *  7/2009  Lee ..................... H01G 9/0029
                                                 361/523
(Continued)

FOREIGN PATENT DOCUMENTS

CN      1790651 A    6/2006
CN    101542722 A    9/2009
(Continued)

OTHER PUBLICATIONS

Intellectual Property Office, Ministry of Economic Affairs, R.O.C., "Office Action", Jun. 1, 2015, Taiwan.
(Continued)

*Primary Examiner* — Selim Ahmed
(74) *Attorney, Agent, or Firm* — Locke Lord LLP; Tim Tingkang Xia, Esq.

(57) ABSTRACT

A semiconductor substrate assembly includes a semiconductor material layer, a first isolation layer, a second isolation layer, a first conductive pillar, and a second conductive pillar. The semiconductor material layer has a first surface and a second surface opposite to the first surface. The first isolation layer is located on the first surface of the semiconductor material layer. The second isolation layer is located on the second surface of the semiconductor material layer. The first conductive pillar, supplied with a first voltage, penetrates the semiconductor material layer, the first isolation layer, and the second isolation layer. The second conductive pillar is supplied with to a second voltage, and a part of the second conductive pillar is formed in the second isolation layer, the second conductive pillar penetrates the second isolation layer and touches the second surface of the semiconductor material layer.

23 Claims, 14 Drawing Sheets

(51) Int. Cl.
*H01L 23/522* (2006.01)
*H01L 21/02* (2006.01)
*H01L 23/498* (2006.01)
*H01L 23/66* (2006.01)
*H01L 25/065* (2006.01)
*H01L 23/14* (2006.01)

(52) U.S. Cl.
CPC ........ *H01L23/5223* (2013.01); *H01L 23/5228* (2013.01); *H01L 23/64* (2013.01); *H01L 23/66* (2013.01); *H01L 25/0657* (2013.01); *H01L 23/147* (2013.01); *H01L 2224/0401* (2013.01); *H01L 2224/05009* (2013.01); *H01L 2224/06181* (2013.01); *H01L 2224/81192* (2013.01); *H01L 2225/06513* (2013.01); *H01L 2225/06541* (2013.01); *H01L 2924/10253* (2013.01); *H01L 2924/19015* (2013.01); *H01L 2924/19041* (2013.01); *H01L 2924/19043* (2013.01); *H01L 2924/19104* (2013.01); *H01L 2924/3011* (2013.01)

(56) References Cited

U.S. PATENT DOCUMENTS

| | | |
|---|---|---|
| 7,589,390 B2 | 9/2009 | Yao |
| 7,592,219 B2 | 9/2009 | Lin et al. |
| 7,691,747 B2 | 4/2010 | Lin et al. |
| 7,741,152 B2 | 6/2010 | Huang et al. |
| 7,772,081 B2 | 8/2010 | Lin et al. |
| 7,791,429 B2 | 9/2010 | Chen et al. |
| 7,799,678 B2 | 9/2010 | Kropewnicki et al. |
| 7,863,106 B2 | 1/2011 | Christo et al. |
| 7,964,972 B2 | 6/2011 | Matsui |
| 8,021,926 B2 | 9/2011 | de Fresart et al. |
| 8,294,240 B2 | 10/2012 | Nowak et al. |
| 8,361,875 B2 | 1/2013 | Zhu |
| 8,426,743 B2 | 4/2013 | Corisis et al. |
| 2007/0222551 A1 | 9/2007 | Lai et al. |
| 2009/0261466 A1 | 10/2009 | Pagaila et al. |
| 2009/0267194 A1 | 10/2009 | Chen |
| 2010/0148316 A1 | 6/2010 | Kim et al. |
| 2010/0163296 A1 | 7/2010 | Ko et al. |
| 2011/0027962 A1 | 2/2011 | Bernstein et al. |
| 2011/0108948 A1 | 5/2011 | Kim et al. |
| 2011/0215457 A1 | 9/2011 | Park |
| 2011/0233785 A1 | 9/2011 | Koester et al. |

FOREIGN PATENT DOCUMENTS

| | | |
|---|---|---|
| CN | 101661920 A | 3/2010 |
| CN | 102376595 A | 3/2012 |
| CN | 102446830 A | 5/2012 |
| TW | 200814268 A | 3/2008 |
| TW | 201036137 A | 10/2010 |
| TW | 201210220 A | 3/2012 |
| TW | 201407729 A | 2/2014 |

OTHER PUBLICATIONS

Song et al., A Wide-Band Passive Equalizer Design on PCB Based on Near-End Crosstalk and Reflections for 12.5 Gbps Serial Data Transmission, IEEE Microwave and Wireless Components Letters, 2008, vol. 18, No. 12, pp. 794-796.

Kim et al., Through Silicon Via (TSV) Equalizer, IEEE 18th Conference on Electrical Performance of Electronic Packaging and Systems, 2009, EPEPS 2009, pp. 13-16.

Sun et al., RC Passive Equalizer for Through Silicon Via, IEEE 19th Conference on Electrical Performance of Electronic Packaging and Systems, 2010, EPEPS 2010, pp. 45-48.

Sun et al., Passive Equalizer Design for Through Silicon Vias with Perfect Compensation, IEEE Transactions on Components, Packaging and Manufacturing Technology, 2011, vol. 1, No. 11, pp. 1815-1822.

Salah et al., Compact Lumped Element Model for TSV in 3D-ICs, IEEE International Symposium on Circuits and Systems (ISCAS), 2011, pp. 2321-2324.

State Intellectual Property Office of the P. R. C, "Office Action", Oct. 10, 2015, China.

* cited by examiner

SEMICONDUCTOR SUBSTRATE ASSEMBLY WITH EMBEDDED RESISTANCE ELEMENT

CROSS-REFERENCE TO RELATED APPLICATIONS

This non-provisional application is a continuation-in-part patent application of U.S. application Ser. No. 13/797,366 filed on Mar. 12, 2013 and also claims priority under 35 U.S.C. §119(a) on Patent Application No(s). 103121406 filed in Taiwan, R.O.C. on Jun. 20, 2014, the entire contents of which are hereby incorporated by reference.

TECHNICAL FIELD

The disclosure relates to a semiconductor substrate assembly.

BACKGROUND

To fulfill the high density package and wider channel bandwidth of the high speed integrated circuit (IC), a through-silicon via (TSV) plays an important role in the three dimension integrated circuit (3D ICs) technology. The TSV is a vertical electrical connection between chips, thereby reducing the length of connection lines greatly. Moreover, silicon interposers are also applied to the outside connection of the 3D ICs. The silicon interposers can provide two dimension (2D) connection line layers as well as connection lines between multiple chips laminated in a third dimension. When such 3D ICs are applied to a high speed digital device, the TSVs and the silicon interposers need to support wider bandwidth and be minimized, whereby the high speed digital device may have higher performance and a minimized size.

On the other hand, dielectric layers are used for isolating the TSVs from a silicon substrate. Because of the electric conductivity of the chip body, the dielectric layer and the chip body may cooperate to cause inevitable capacitance effect. The capacitance effect and the energy consumption of a silicon carrier in the 3D IC will cause the distortion or decay of high speed digital signal according to the changing of signal frequency. To preventing the decay of signals in the high speed signal transmission (e.g. 20 or 25 Gbps), equalizer circuits are designed to reduce the non-linear transmission loss.

Generally, a passive equalizer circuit requires resistance components and capacitance components. Such resistance components and capacitance components need extra material and fabrication processes in the design and manufacture of the 3D IC. Moreover, adding equalizer circuits in the 3D IC will increase the chip size and the manufacture cost and complicate the chip design.

SUMMARY

According to one or more embodiments, the disclosure provides a substrate. In one embodiment, the substrate includes a semiconductor material layer, a first isolation layer, a second isolation layer, a first conductive pillar, and a second conductive pillar. The semiconductor material layer has a first surface and a second surface opposite to the first surface. The first isolation layer is located on the first surface of the semiconductor material layer. The second isolation layer is located on the second surface of the semiconductor material layer. The first conductive pillar penetrates the semiconductor material layer, the first isolation layer, and the second isolation layer and is supplied with a first voltage. The second conductive pillar is located in the second isolation layer partially, penetrates the second isolation layer, connects to the second surface of the semiconductor material layer, and is supplied with a second voltage.

According to one or more embodiments, the disclosure provides a semiconductor substrate assembly. In one embodiment, the semiconductor substrate assembly includes a substrate, a first conductive pad, a second conductive pad, a first conductive pillar, a dielectric layer, a third conductive pad, a fourth conductive pad, a fifth conductive pad, a first isolation layer, and a second isolation layer. The substrate has a first surface and a second surface opposite to the first surface. The first conductive pad is located at a preset location on the first surface of the substrate. The second conductive pad is located at a preset location on the second surface of the substrate, and the preset location of the second conductive pad corresponds to the preset location of the first conductive pad. The first conductive pillar is located in the substrate and electrically connects to the first conductive pad and the second conductive pad. The dielectric layer is located on the second conductive pad. The third conductive pad is located on the second surface of the substrate and is at a first side of the second conductive pad. The fourth conductive pad is located on the second surface of the substrate and at a second side of the second conductive pad opposite to the first side of the second conductive pad. The fifth conductive pad is located on the dielectric layer, the third conductive pad, and the fourth conductive pad and electrically connects to the third conductive pad and the fourth conductive pad. The first isolation layer is located on the rest of the first surface of the substrate. The second isolation layer is located on the rest of the second surface of the substrate.

BRIEF DESCRIPTION OF THE DRAWINGS

The present disclosure will become more fully understood from the detailed description given herein below for illustration only and thus does not limit the present disclosure, wherein.

DETAILED DESCRIPTION

Figure 1:
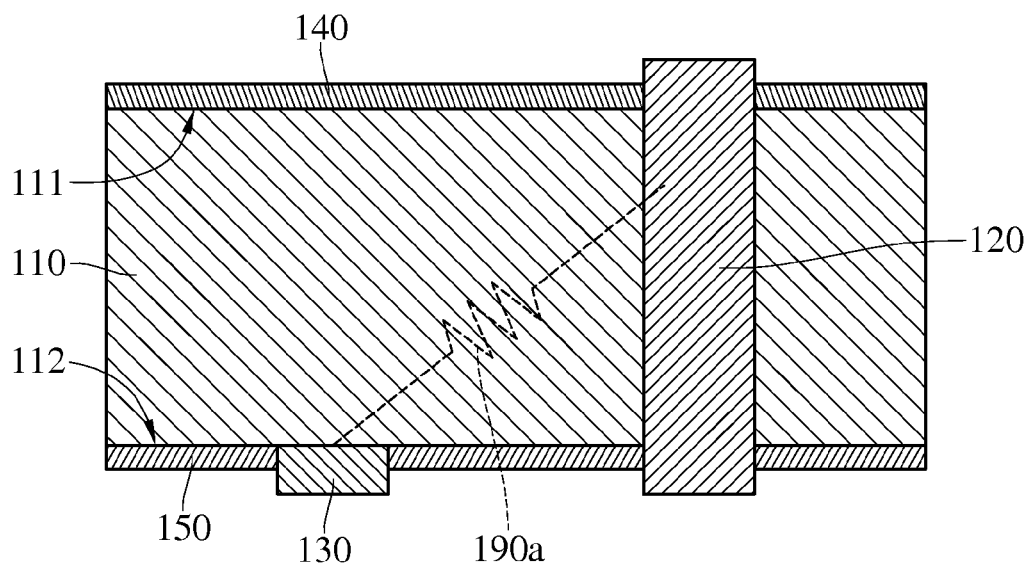
FIG. 1 is a schematic diagram of a first embodiment of a semiconductor substrate assembly in the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

FIG. 1 is a schematic diagram of a first embodiment of a semiconductor substrate assembly in the disclosure. A semiconductor substrate assembly 100 includes, for example, a substrate 110, a first conductive pillar 120, a second conductive pillar 130, a first isolation layer 140, and a second isolation layer 150.

The substrate 110 has a first surface 111 and a second surface 112, and the first surface 111 is opposite to the second surface 112. For example, the substrate 110 is a silicon substrate, a chip semiconductor, a silicon semiconductor, or a semiconductor interposer.

The first conductive pillar 120 is located in the substrate 110 and extends from the first surface 111 of the substrate 110 to the second surface 112 of the substrate 110. The first conductive pillar 120 extends out from the first surface 111 of the substrate 110 and passes through the first isolation layer 140. Moreover, the first conductive pillar 120 also extends out from the second surface 112 of the substrate 110 and passes through the second isolation layer 150. For instance, the first conductive pillar 120 is a cylinder such that two opposite terminals of the first conductive pillar 120 are exposed at two corresponding locations on two opposite surfaces of the substrate 110 respectively. The first conductive pillar 120 protrudes above a first surface of the first isolation layer 140 opposite to a second surface of the first isolation layer 140 close to the substrate 110 and protrudes above a first surface of the isolation layer 150 opposite to a second surface of the second isolation layer 150 close to the substrate 110. In the embodiment, the first conductive pillar 120 is made of, for example, metal and is supplied with a first voltage.

The second conductive pillar 130 is located on the second surface 112 of the substrate 110 and at a side of the first conductive pillar 120. In practice, the second conductive pillar 130 extends from the second surface 112 of the substrate 110, passes through the second isolation layer 150, and protrudes above the first surface of the isolation layer 150. The second conductive pillar 130 is supplied with a second voltage.

In the embodiment, a resistance component 190a is formed by the first conductive pillar 120, the second conductive pillar 130, and a part of the substrate 110 between the first conductive pillar 120 and the second conductive pillar 130, as shown by the resistor drawn by a dotted line in FIG. 1. The impedance value of the resistance component 190a will be affected by the height of the substrate 110 as well as the distance between the first conductive pillar 120 and the second conductive pillar 130. For example, the more the first conductive pillar 120 is close to the second conductive pillar 130, the more the impedance value of the resistance component 190a reduces.

Figure 2:
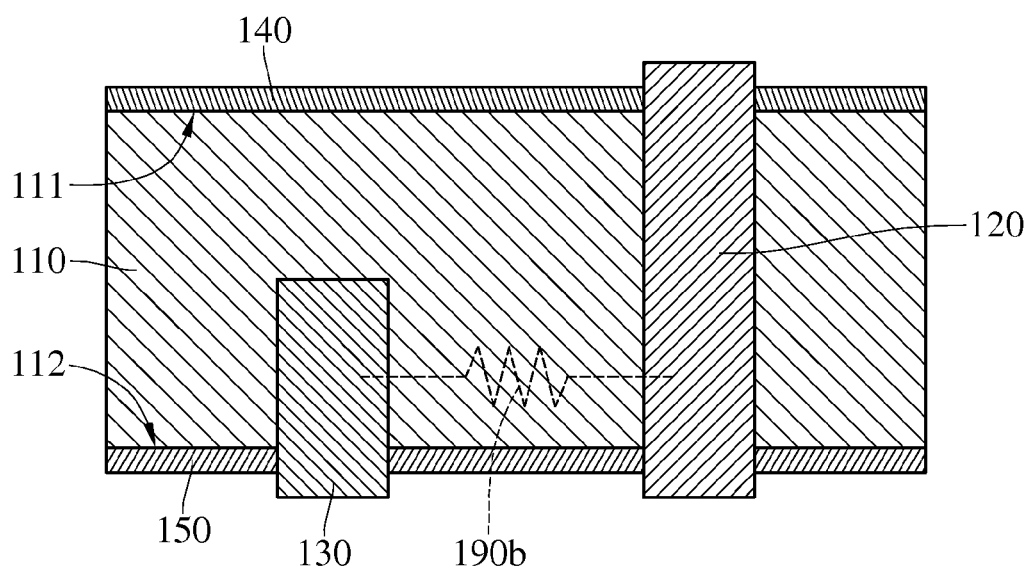
FIG. 2 is a schematic diagram of a second embodiment of semiconductor substrate assembly in the disclosure.

FIG. 2 is a schematic diagram of a second embodiment of semiconductor substrate assembly in the disclosure. A semiconductor substrate assembly 200 in this embodiment is similar to the semiconductor substrate assembly 100 in FIG. 1. The semiconductor substrate assembly 200 includes, for example, a substrate 110, a first conductive pillar 120, a second conductive pillar 130, a first isolation layer 140, and a second isolation layer 150. The arrangement and structural relationship among the substrate 110, the first conductive pillar 120, the first isolation layer 140, and the second isolation layer 150 can be referred to those in FIG. 1 and thus will not be repeated hereinafter. Nevertheless, the length of the second conductive pillar 130 in FIG. 2 is different from that in FIG. 1.

In FIG. 2, the second conductive pillar 130 not only protrudes above the second surface 112 of the substrate 110 but also exists in the substrate 110. In other words, the second conductive pillar 130 is formed by, for example, inwardly being extended from the second surface 112 of the substrate 110 to form a via. The second conductive pillar 130 is made of, for example, metal. In the embodiment, the height of the second conductive pillar 130 is different from the height of the first conductive pillar 120. For example, the height of the second conductive pillar 130 is smaller than the height of the first conductive pillar 120 in FIG. 2.

Moreover, a resistance component 190b (as shown in a resistor drawn by a dotted line in FIG. 2) is formed by the first conductive pillar 120, the second conductive pillar 130, and a part of the substrate 110 between the first conductive pillar 120 and the second conductive pillar 130. The impedance value of the resistance component 190b will be affected by the height of the second conductive pillar 130 in the substrate 110 as well as the distance between the first conductive pillar 120 and the second conductive pillar 130. For instance, the more the first conductive pillar 120 is close to the second conductive pillar 130, the more the impedance value of the resistance component 190b reduces. The height of the second conductive pillar 130 in the substrate 110 can be designed according to actual requirements. However, the more the height of the second conductive pillar 130 in the substrate 110 increases, the more the impedance value of the resistance component 190b reduces.

Figure 3A:
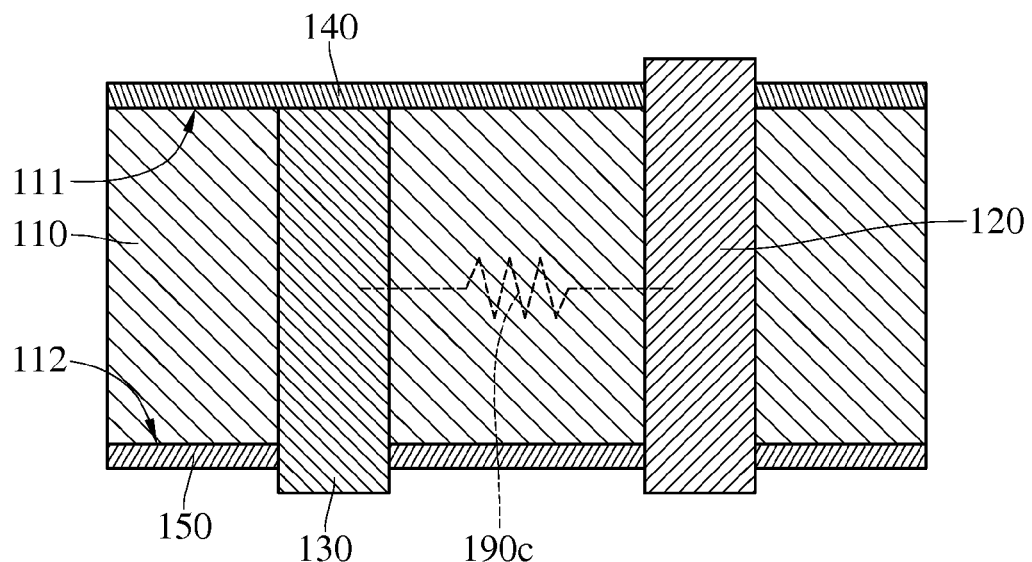
FIG. 3A is a schematic diagram of a third embodiment of semiconductor substrate assembly in the disclosure.

FIG. 3A is a schematic diagram of a third embodiment of semiconductor substrate assembly in the disclosure. A semiconductor substrate assembly 300 in this embodiment is similar to the semiconductor substrate assembly 200 in FIG. 2. The semiconductor substrate assembly 300 includes, for example, a substrate 110, a first conductive pillar 120, a second conductive pillar 130, a first isolation layer 140, and a second isolation layer 150.

However, the height of the second conductive pillar 130 in FIG. 3A is different from that in FIG. 2. In other words, the height of the second conductive pillar 130 and the height of the first conductive pillar 120 in the substrate 110 are equal to each other in FIG. 3A. The second conductive pillar 130 is inwardly extended from the second surface 112 of the substrate 110 to the first surface 111 and then touches the first isolation layer 140.

On the other hand, a resistance component 190c (as shown by a resistor drawn by a dotted line in FIG. 3A) is formed by the first conductive pillar 120, the second conductive pillar 130, and a part of the substrate 110 between the first conductive pillar 120 and the second conductive pillar 130. The impedance value of the resistance component 190c will be affected by the distance between the second conductive pillar 130 and the first conductive pillar 120. For example, the more the first conductive pillar 120 is close to the second conductive pillar 130, the more the impedance value of the resistance component 190c reduces.

Figure 3B:
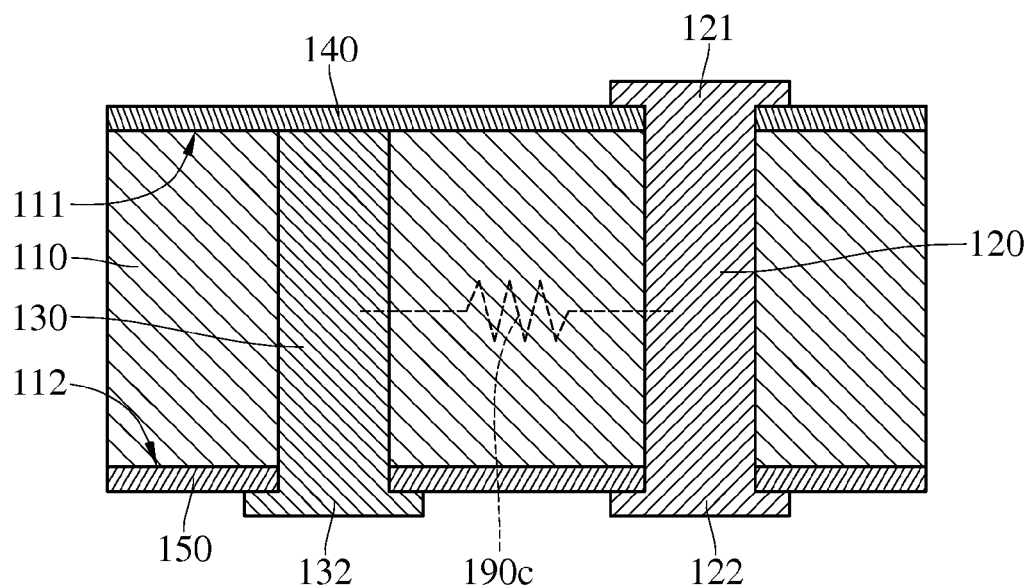
FIG. 3B is another schematic diagram of a third embodiment of semiconductor substrate assembly in the disclosure.

FIG. 3B is another schematic diagram of a third embodiment of semiconductor substrate assembly in the disclosure. A semiconductor substrate assembly 300 in FIG. 3B is similar to the semiconductor substrate assembly 300 in FIG. 3A. The semiconductor substrate assembly 300 in FIG. 3B includes, for example, a substrate 110, a first conductive pillar 120, a second conductive pillar 130, a first isolation layer 140, and a second isolation layer 150. However, the first conductive pillar 120 in FIG. 3B comprises conductive pads 121 (i.e. a first conductive pad) and 122 (i.e. a second conductive pad), and the second conductive pillar 130 in FIG. 3B comprises a conductive pad 132.

The first conductive pillar 120 extends out from the first surface 111 of the substrate 110 and, after passing through the first isolation layer 140, spreads out from the first isolation layer 140 to form the conductive pad 121 that partially covers on the first isolation layer 140. The first conductive pillar 120 extends out from the second surface 112 of the substrate 110 and, after passing through the second isolation layer 150, spreads out from the second isolation layer 150 to form the conductive pad 122 that partially covers on the second isolation layer 150. The second conductive pillar 130 extends from the first surface 111 of the substrate 110 and, after passing through the second isolation layer 150, spreads out from the second isolation layer 150 to form the conductive pad 132 that partially covers on the second isolation layer 150.

The conductive pads 121 and 122 belong to the first conductive pillar 120. The conductive pads 121 and 122 of the first conductive pillar 120 have an area that is approximately larger than the cross-sectional area of the first conductive pillar 120 in the substrate 110 along a direction vertical to the normal line of the substrate 110. The area of the conductive pad 121 is, for instance, approximately equal to that of the conductive pad 122.

If the areas of the conductive pads 121 and 122 respectively protruding above the first isolation layer 140 and the second isolation layer 150 are approximately equal to the cross-sectional area of the first conductive pillar 120 in the substrate 110 along the direction vertical to the normal line of the substrate 110 in FIG. 3A, the first conductive pillar 120 in FIG. 3B will be considered as the first conductive pillar 120 in FIG. 3A. In other words, the embodiment in FIG. 3B illustrates that the part of the conductive pillar extended out of the substrate has various shapes, as the embodiment in FIG. 3A illustrates that the conductive pillar is limited to be a cylinder.

For the illustration purpose, the following embodiments employ a semiconductor substrate assembly with conductive pads.

Figure 4:
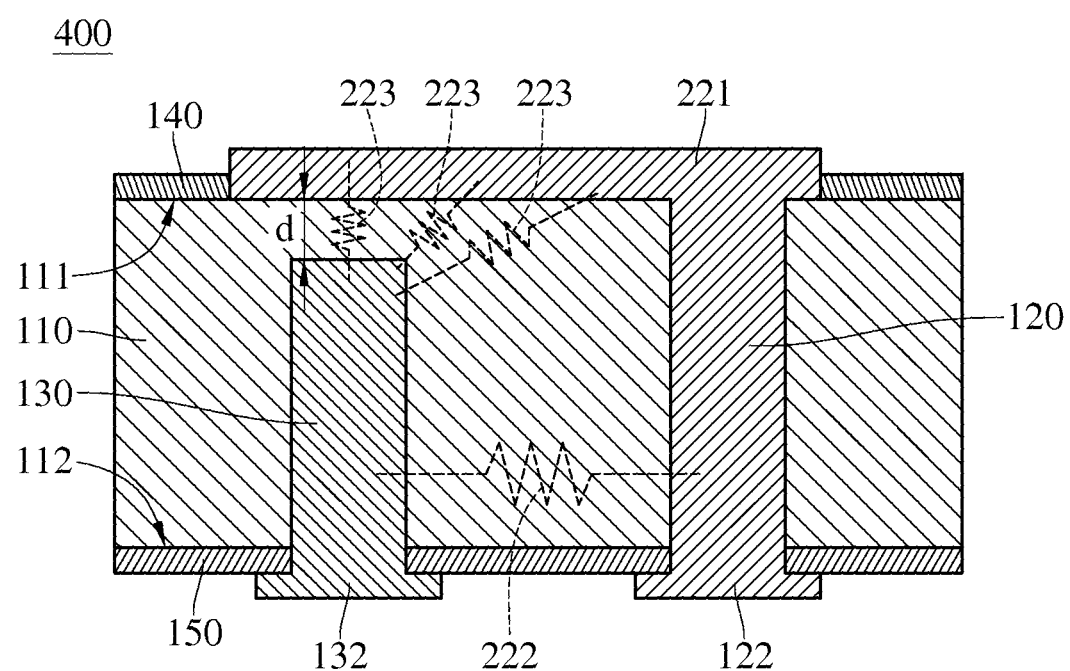
FIG. 4 is a schematic diagram of a fourth embodiment of semiconductor substrate assembly in the disclosure.

FIG. 4 is a schematic diagram of a fourth embodiment of semiconductor substrate assembly in the disclosure. A semiconductor substrate assembly 400 in FIG. 4 is similar to the semiconductor substrate assemblies in FIGS. 2 and 3B. The semiconductor substrate assembly 400 herein includes a substrate 110, a conductive pad 221 (i.e. a first conductive pad), a conductive pad 122 (i.e. a second conductive pad), a first conductive pillar 120, a conductive pad 132, a first isolation layer 140, a second isolation layer 150, and a second conductive pillar 130.

The difference between the conductive pad 221 in FIG. 4 and the conductive pad 121 in FIG. 3B is that the conductive pad 221 is extended to a position corresponding to the location of the conductive pad 132. The size of the first conductive pad 221 is larger than that of the conductive pad 121 in FIG. 3B. The conductive pad 221 and the second conductive pillar 130 are separated from each other and have a distance d therebetween.

Furthermore, a first resistance component 222 (as shown by a resistor drawn by a dotted line in FIG. 4) is formed by the first conductive pillar 120, the second conductive pillar 130, and a part of the substrate 110 between the first conductive pillar 120 and the second conductive pillar 130, and second resistance components 223 (as shown by resistors drawn by dotted lines in FIG. 4) are formed by the conductive pad 221, the second conductive pillar 130, and a part of the substrate 110 between the conductive pad 221 and the second conductive pillar 130. Since the conductive pad 221 and the first conductive pillar 120 are connected and the conductive pad 132 and the second conductive pillar 130 are connected, the first resistance component 222 and the second resistance component 223 are coupled in parallel. The impedance value of the resistance component 222 is affected by the distance between the second conductive pillar 130 and the first conductive pillar 120 as well as the height of the second conductive pillar 130, and the impedance value of the resistance component 223 is affected by the height of the second conductive pillar 130.

Figure 5:
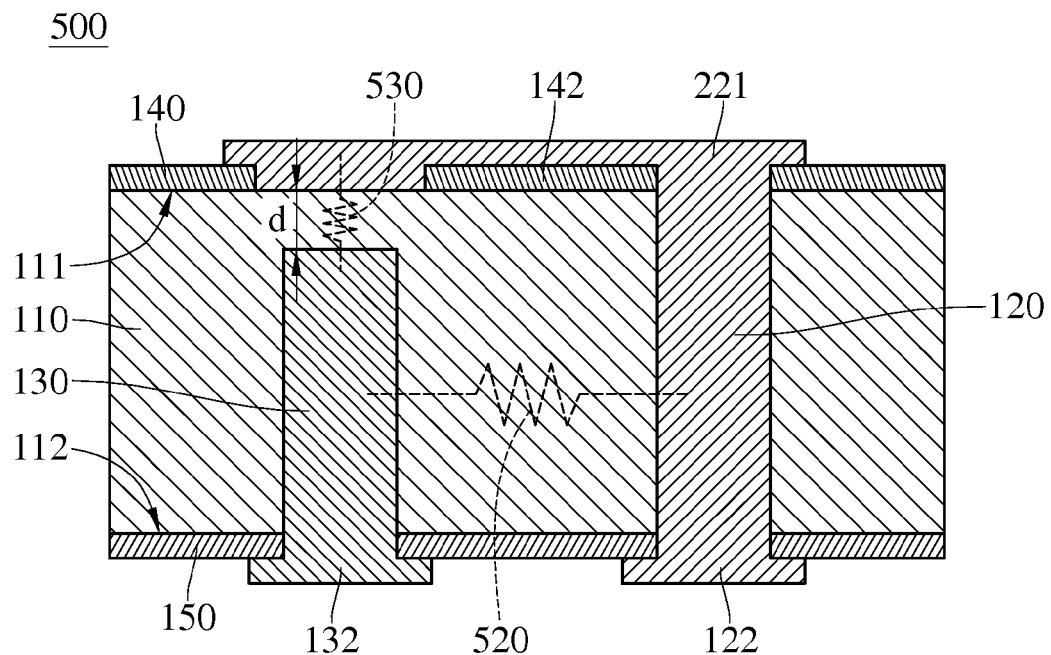
FIG. 5 is a schematic diagram of a fifth embodiment of semiconductor substrate assembly in the disclosure.

FIG. 5 is a schematic diagram of a fifth embodiment of semiconductor substrate assembly in the disclosure. A semiconductor substrate assembly 500 in this embodiment is similar to the semiconductor substrate assembly 400 in FIG. 4. The semiconductor substrate assembly 500 includes the substrate 110, the conductive pad 221, the conductive pad 122, the first conductive pillar 120, the conductive pad 132, the first isolation layer 140, the second isolation layer 150, and the second conductive pillar 130 in FIG. 4 and further includes a third isolation layer 142.

The third isolation layer 142 is located between the substrate 110 and a part of the conductive pad 221. In this embodiment, a first resistance component 520 (as shown by a resistor drawn by a dotted line in FIG. 5) is formed by the first conductive pillar 120, the second conductive pillar 130, and a part of the substrate 110 between the first conductive pillar 120 and the second conductive pillar 130. Similarly, a second resistance component 530 (as shown by a resistor drawn by a dotted line in FIG. 5) is formed by the conductive pad 221, the second conductive pillar 130, and a part of the substrate 110 between the conductive pad 221 and the second conductive pillar 130. The first resistance component 520 and the second resistance component 530 are connected in parallel. The impedance value of the first resistance component 520 is affected by the distance between the second conductive pillar 130 and the first conductive pillar 120 as well as the height of the second conductive pillar 130. The impedance value of the second resistance component 530 is affected by the height of the second conductive pillar 130.

Figure 6:
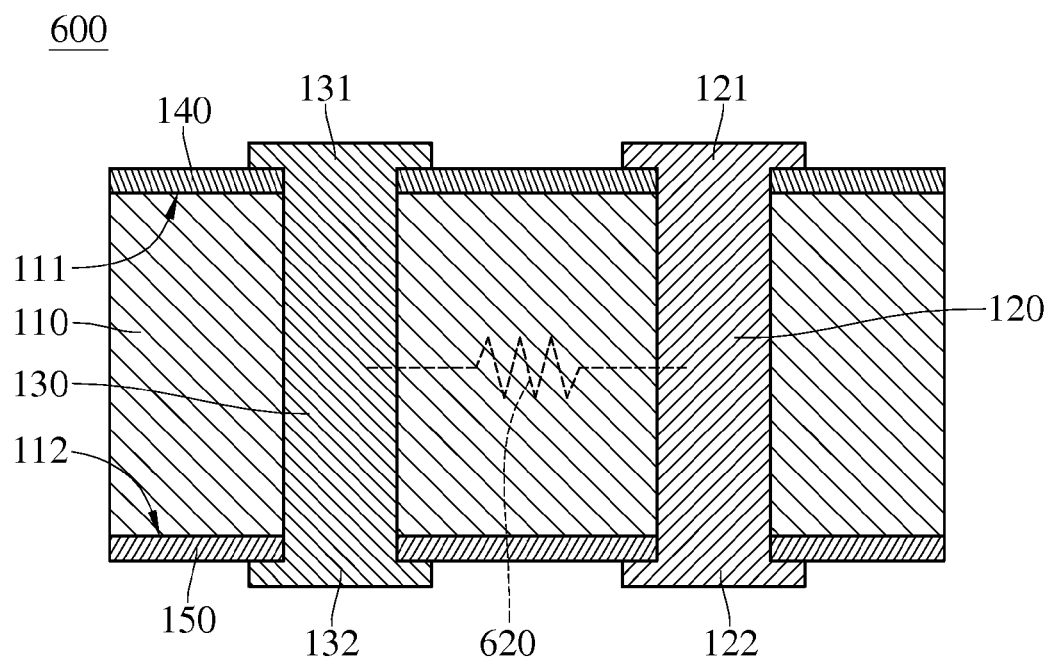
FIG. 6 is a schematic diagram of a sixth embodiment of semiconductor substrate assembly in the disclosure.

FIG. 6 is a schematic diagram of a sixth embodiment of semiconductor substrate assembly in the disclosure. A semiconductor substrate assembly 600 is similar to the semiconductor substrate assembly 300 in FIG. 3. The semiconductor substrate assembly 600 includes not only the comprising substrate 110, the conductive pad 121, the conductive pad 122, the first conductive pillar 120, the conductive pad 132, the first isolation layer 140, the second isolation layer 150, and the second conductive pillar 130 in FIG. 3 but also a conductive pad 131.

The conductive pad 131 is located on the first surface 111 of the substrate 110 and touches the second conductive pillar 130, and the location of the conductive pad 131 corresponds to (or is opposite to) the location of the conductive pad 132. Among the first conductive pillar 120, the second conductive pillar 130, and a part of the substrate 110 between the first conductive pillar 120 and the second conductive pillar 130, a resistance component 620 is formed, as shown by a resistor drawn by a dotted line in FIG. 6. The impedance value of the resistance component 620 is affected by the distance between the second conductive pillar 130 and the first conductive pillar 120.

In the previous embodiments, the width (or the diameter) of the first conductive pillar 120 is smaller than the widths of the conductive pads 121 and 122, and the width of the second conductive pillar 130 is smaller than the conductive pads 131 and 132. Alternately, the width of the first conductive pillar 120 is larger than or equal to the widths of the conductive pads 121 and 122, and the width of the second conductive pillar 130 is larger than or equal to the conductive pads 131 and 132. Therefore, the disclosure has no limitation on the ratio of the conductive pillar to the conductive pad in the previous embodiments. Similarly, the following embodiments can be deduced.

Figure 7A:
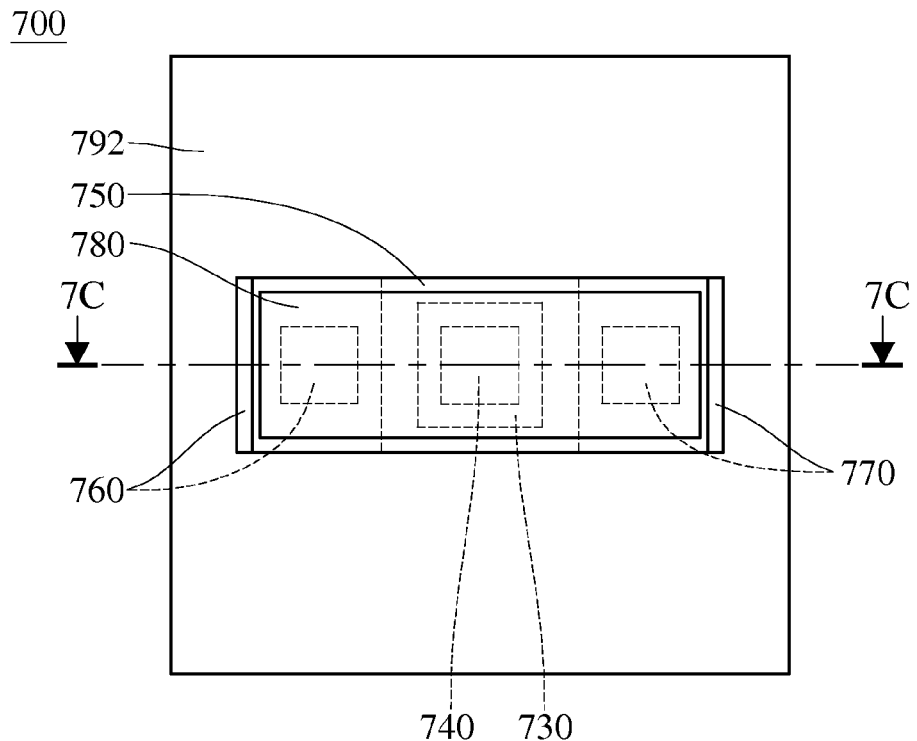
FIG. 7A is a bottom view of a seventh embodiment of semiconductor substrate assembly in the disclosure.
Figure 7B:
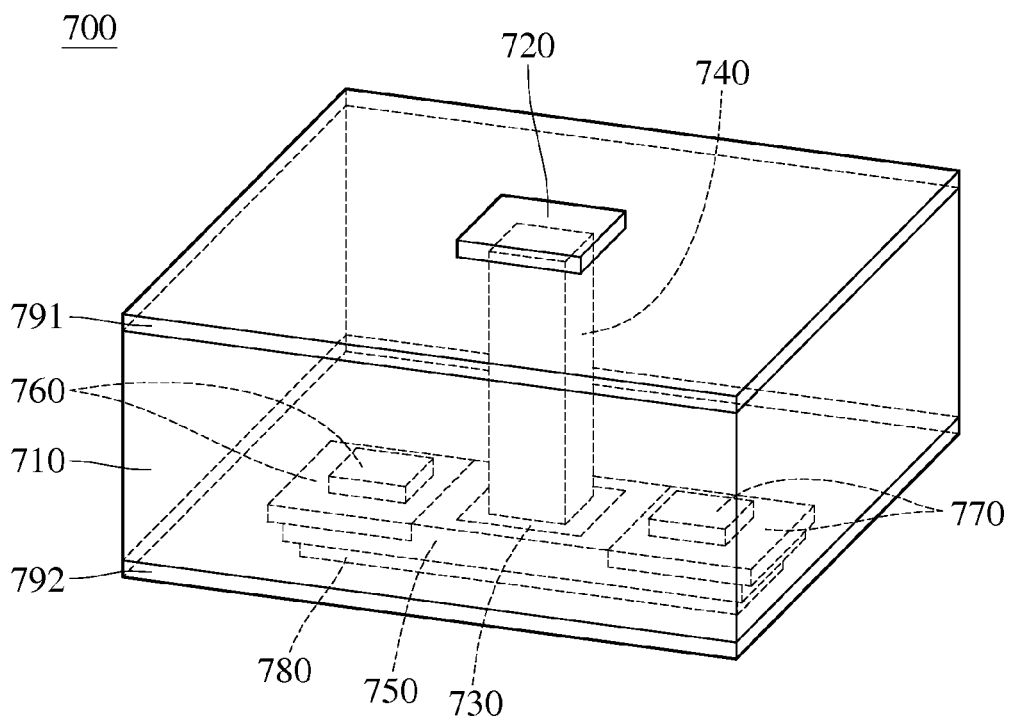
FIG. 7B is a three-dimensional perspective view of the seventh embodiment of semiconductor substrate assembly in the disclosure.
Figure 7C:
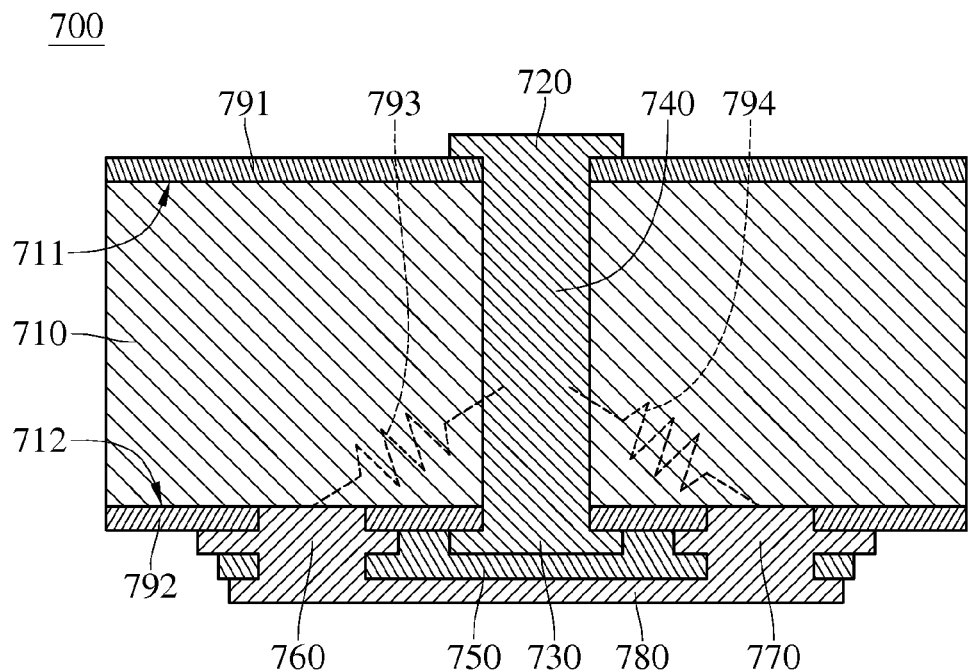
FIG. 7C is a cross-sectional view of the seventh embodiment of semiconductor substrate assembly in the disclosure along a cross-sectional line 7C-7C.

Please refer to FIGS. 7A to 7C. FIG. 7A is a bottom view of a seventh embodiment of semiconductor substrate assembly in the disclosure, FIG. 7B is a three-dimensional perspective view of the seventh embodiment of semiconductor substrate assembly in the disclosure; and FIG. 7C is a cross-sectional view of the seventh embodiment of semiconductor substrate assembly in the disclosure along a cross-sectional line 7C-7C shown in FIG. 7A. A semiconductor substrate assembly 700 includes a substrate 710, a first conductive pad 720, a second conductive pad 730, a first conductive pillar 740, a dielectric layer 750, a third conductive pad 760, a fourth conductive pad 770, a fifth conductive pad 780, a first isolation layer 791, and a second isolation layer 792.

The substrate 710 has a first surface 711 and a second surface 712, and the first surface 711 is opposite to the second surface 712. For example, the substrate 710 is a silicon substrate, chip semiconductor, a silicon semiconductor, or a semiconductor interposer.

The first conductive pad 720 is located at a preset location on the first surface 711 of the substrate 710. The second conductive pad 730 is located at a preset location on the second surface 712 of the first conductive pad 720. The first conductive pillar 740 is located in the substrate 710, and the first conductive pillar 740, the first conductive pad 720, and the second conductive pad 730 are connected. For instance, the first conductive pad 720 and the second conductive pad 730 are formed by extending the first conductive pillar 740, but the disclosure will not be limited thereto. For example, the first conductive pillar 740 is made of metal.

The dielectric layer 750 is located on the second conductive pad 730 and has two opens which the third conductive pad 760 and the fourth conductive pad 770 can respectively pass through. The third conductive pad 760 is located on the second surface 712 of the substrate 710. The fourth conductive pad 770 is located on the second surface 712 of the substrate 710. In this embodiment, the third conductive pad 760 and the fourth conductive pad 770 are respectively located at two opposite sides of the second conductive pad 730 along the cross-sectional line 7C-7C. In other one embodiment, the third conductive pad 760 and the fourth conductive pad 770 are respectively located at two opposite sides of the second conductive pad 730 along a direction vertical to the cross-sectional line 7C-7C. In other one embodiment, the third conductive pad 760 and the fourth conductive pad 770 are located at the same side of the second conductive pad 730. The disclosure will not be limited by the above embodiments of the locations of the third conductive pad 760 and the fourth conductive pad 770. In other words, the third conductive pad 760 and the fourth conductive pad 770 can be located at any suitable locations around the second conductive pad 730.

The fifth conductive pad 780 is formed on the dielectric layer 750, the third conductive pad 760, and the fourth conductive pad 770. The fifth conductive pad 780, the third conductive pad 760, and the fourth conductive pad 770 are connected. For example, the fifth conductive pad 780 is formed by extending the third conductive pad 760 and the fourth conductive pad 770, but the disclosure will not be limited thereto. The first isolation layer 791 is located on the first surface 711 of the substrate 710. The second isolation layer 792 is located on the second surface 712 of the substrate 710.

Figure 7D:
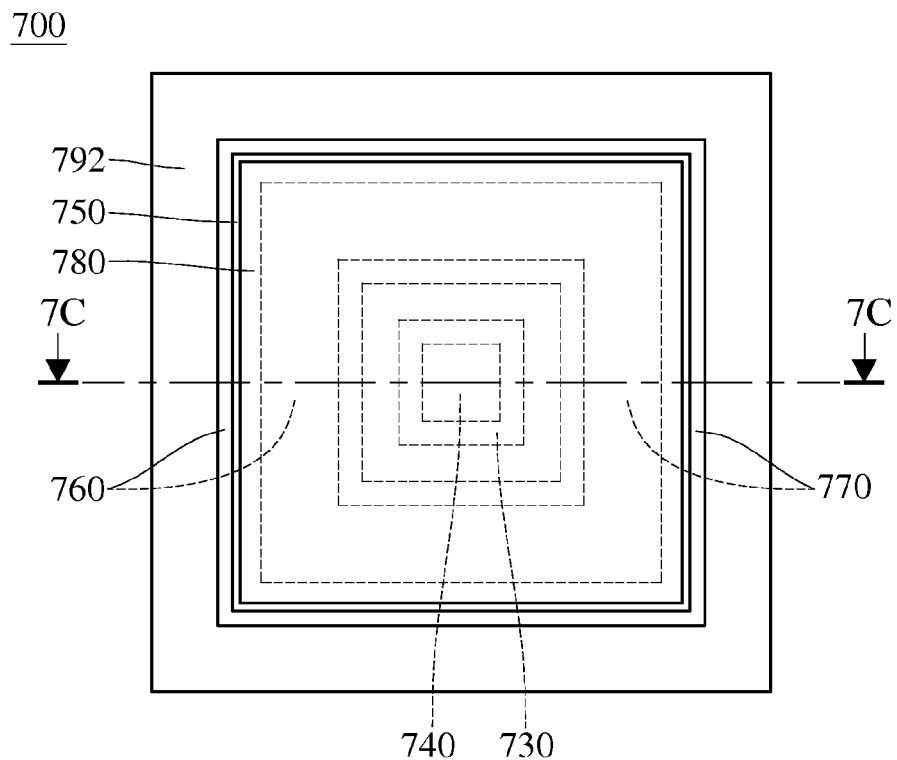
FIG. 7D is a top view of a semiconductor substrate assembly in the disclosure.
Figure 7E:
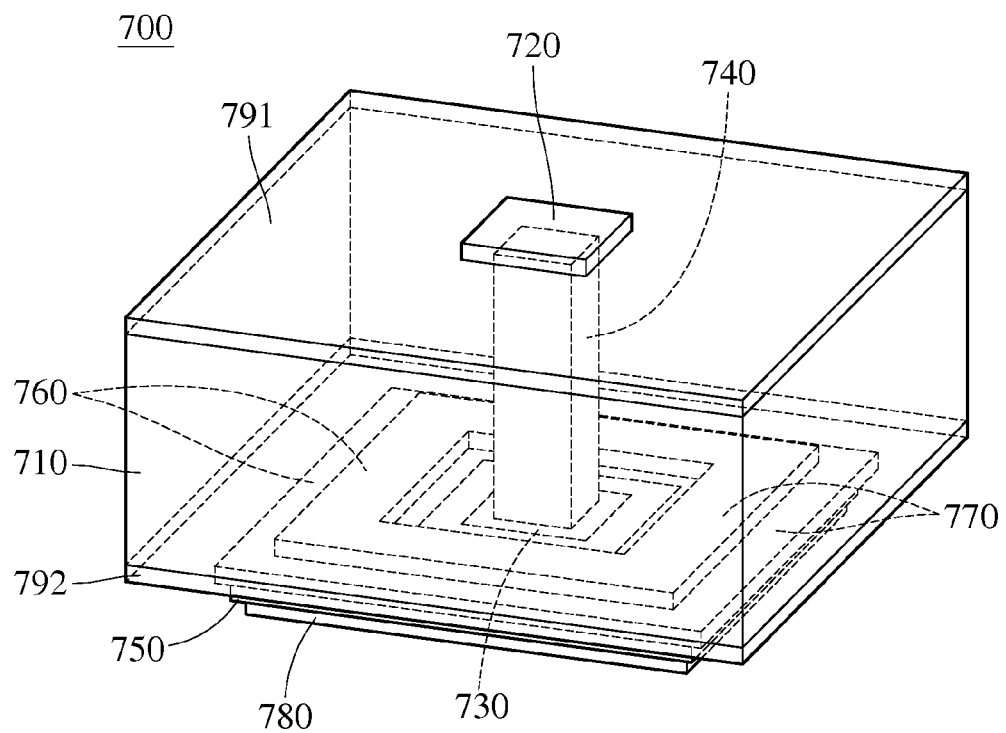
FIG. 7E is a three-dimensional perspective view of the semiconductor substrate assembly in FIG. 7D.

In this embodiment, the third conductive pad 760 and the fourth conductive pad 770 are separated from each other. In another embodiment, the third conductive pad 760 and the fourth conductive pad 770 are directly connected to form a ring conductive pad surrounding the second conductive pad 730, as shown in FIGS. 7D and 7E.

Accordingly, a capacitance component is formed by the second conductive pad 730, the fifth conductive pad 780, and a part of the dielectric layer 750 sandwiched in between the second conductive pad 730 and the fifth conductive pad 780. A first resistance component 793, as shown by a resistor drawn by a dotted line in FIG. 3, is formed by the first conductive pillar 740, the third conductive pad 760, and a part of the substrate 710 between the first conductive pillar 740 and the third conductive pad 760. A second resistance component 794, as shown by a resistor drawn by a dotted line in FIG. 3, is formed by the first conductive pillar 740, the fourth conductive pad 770, and a part of the substrate 710 between the first conductive pillar 740 and the fourth conductive pad 770. In practice, the third conductive pad 760, the fifth conductive pad 780, and the fourth conductive pad 770 are connected, and the first conductive pad 720, the first conductive pillar 740, and the second conductive pad 730 are connected. Therefore, the capacitance component, the first resistance component 793, and the second resistance component 794 are coupled in parallel. The impedance values of the first resistance component 793 and the second resistance component 794 are affected by the height of the substrate 710. The impedance value of the first resistance component 793 is affected by the distance between the first conductive pillar 740 and the third conductive pad 760, and the impedance value of the second resistance component 794 is affected by the distance between the first conductive pillar 740 and the fourth conductive pad 770.

Figure 8:
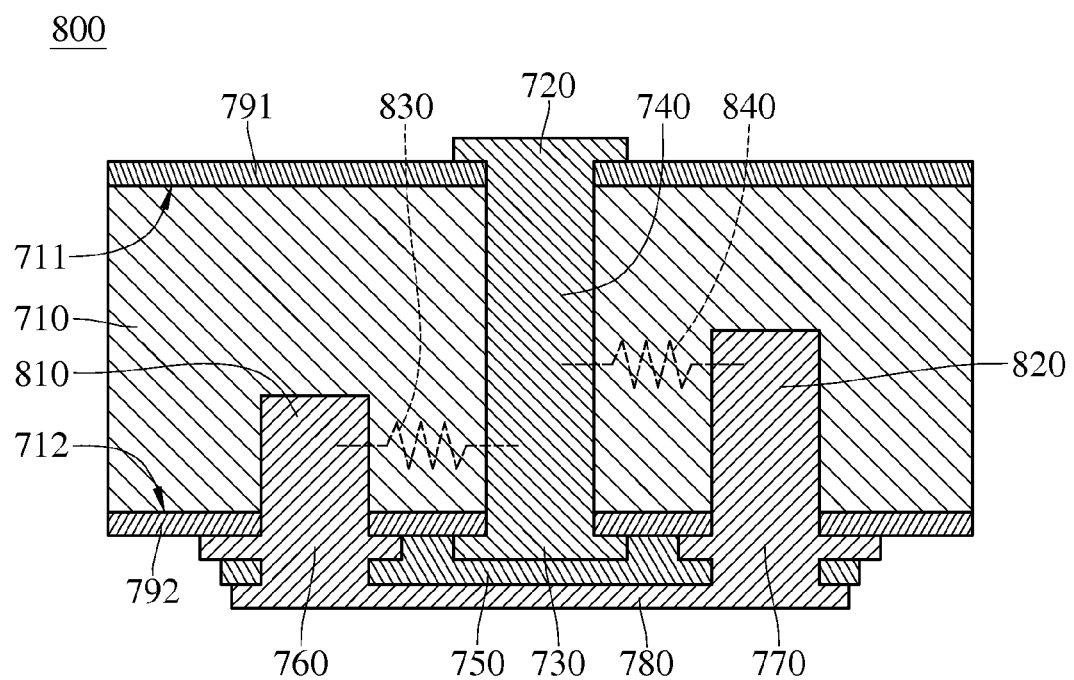
FIG. 8 is a schematic diagram of an eighth embodiment of semiconductor substrate assembly in the disclosure.

FIG. 8 is a schematic diagram of an eighth embodiment of semiconductor substrate assembly in the disclosure. A semiconductor substrate assembly 800 in this embodiment is similar to the semiconductor substrate assembly 700 in FIG. 7A to 7E. The semiconductor substrate assembly 800 includes not only the comprising substrate 710, the first conductive pad 720, the second conductive pad 730, the first conductive pillar 740, the dielectric layer 750, the third conductive pad 760, the fourth conductive pad 770, the fifth conductive pad 780, the first isolation layer 791, and the second isolation layer 792 in FIGS. 7A to 7E but also a second conductive pillar 810 and a third conductive pillar 820. The arrangement and structural relationship among the substrate 710, the first conductive pad 720, the second conductive pad 730, the first conductive pillar 740, the dielectric layer 750, the third conductive pad 760, the fourth conductive pad 770, the fifth conductive pad 780, the first isolation layer 791, and the second isolation layer 792 can be referred to those in the semiconductor substrate assembly 700 and thus, will not be repeated hereinafter.

The second conductive pillar 810 is located in the substrate 710 and touches the third conductive pad 760. The third conductive pillar 820 is located in the substrate 710 and touches the fourth conductive pad 770. The second conductive pillar 810 and the third conductive pillar 820 are respectively extended to form the third conductive pad 760 and the fourth conductive pad 770 by the through-silicon via technology. The second conductive pillar 810 and the third conductive pillar 820 are made of, for example, metal. In this embodiment, the height of the second conductive pillar 810 and the height of the third conductive pillar 820 are different from the height of the first conductive pillar 740. For example, the height of the second conductive pillar 810 and the height of the third conductive pillar 820 are smaller than the height of the first conductive pillar 740, as shown in FIG. 8. In this embodiment, the height of the second conductive pillar 810 is different from that of the third conductive pillar 820. For instance, the height of the second conductive pillar 810 is smaller than that of the third conductive pillar 820, as shown in FIG. 8. Alternately, the height of the second conductive pillar 810 is equal to that of the third conductive pillar 820.

By the first conductive pillar 740, the second conductive pillar 810, and a part of the substrate 710 between the first conductive pillar 740 and the second conductive pillar 810, a first resistance component 830 (as shown by a resistor drawn by a dotted line in FIG. 8) is formed. Similarly, a second resistance component 840 is formed by the first conductive pillar 740, the third conductive pillar 820, and a part of the substrate 710 between the first conductive pillar 740 and the third conductive pillar 820. The impedance values of the first resistance component 830 and the second resistance component 840 are affected by the height of the second conductive pillar 810 and the height of the third conductive pillar 820, and the impedance value of the first resistance component 830 is also affected by the distance between the first conductive pillar 740 and the second conductive pillar 810. The impedance value of the second resistance component 840 is affected by the distance between the first conductive pillar 740 and the third conductive pillar 820.

In practice, the second conductive pillar 810, the third conductive pillar 820, the third conductive pad 760, the fifth conductive pad 780, and the fourth conductive pad 770 are connected, and the first conductive pad 720, the first conductive pillar 740, and the second conductive pad 730 are connected. Therefore, the capacitance component, the first resistance component 830, and the second resistance component 840 are coupled in parallel.

Figure 9:
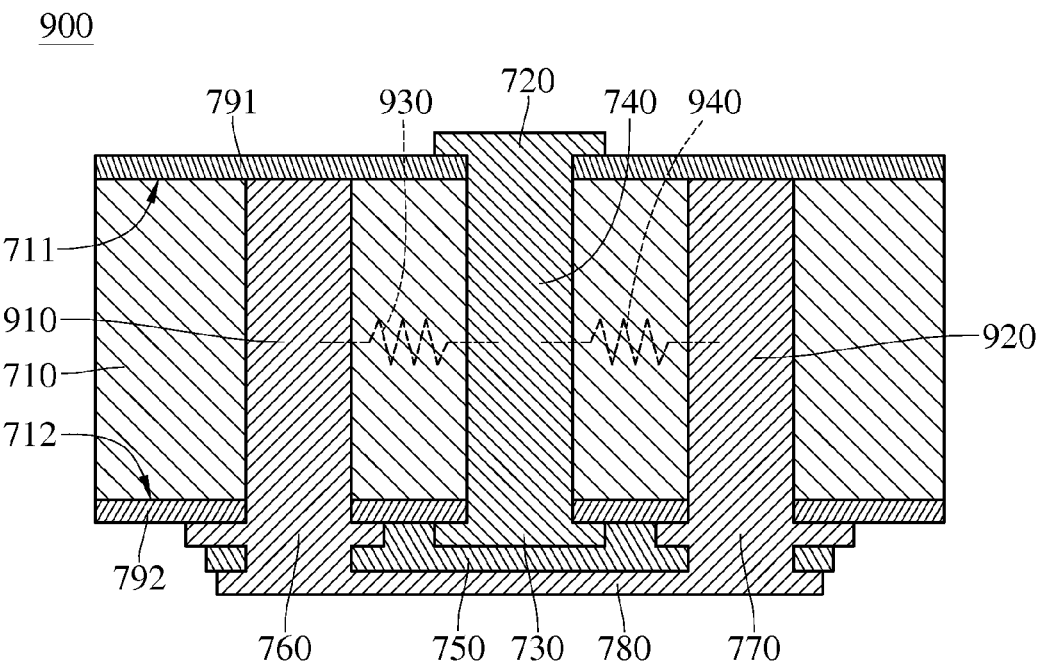
FIG. 9 is a schematic diagram of a ninth embodiment of semiconductor substrate assembly in the disclosure.

FIG. 9 is a schematic diagram of a ninth embodiment of semiconductor substrate assembly in the disclosure. A semiconductor substrate assembly 900 is similar to the semiconductor substrate assembly 800 in FIG. 8. Besides including the substrate 710, the first conductive pad 720, the second conductive pad 730, the first conductive pillar 740, the dielectric layer 750, the third conductive pad 760, the fourth conductive pad 770, the fifth conductive pad 780, the first isolation layer 791, and the second isolation layer 792 in FIG. 8, the semiconductor substrate assembly 900 further includes a second conductive pillar 910 and a third conductive pillar 920.

The second conductive pillar 910 is located in the substrate 710 and touches the third conductive pad 760. The third conductive pillar 920 is located in the substrate 710 and touches the fourth conductive pad 770. The second conductive pillar 910 and the third conductive pillar 920 are made of, for example, metal. Different from the second conductive pillar 810 and the third conductive pillar 820 in FIG. 8, the height of the second conductive pillar 910 and the height of the third conductive pillar 920 are equal to the height of the first conductive pillar 740. One terminal of the second conductive pillar 910 opposite to the third conductive pad 760 touches the first isolation layer 791, and one terminal of the third conductive pillar 920 opposite to the fourth conductive pad 770 touches the first isolation layer 791.

Moreover, a first resistance component 930, as shown by a resistor drawn by a dotted line in FIG. 9, is formed by the first conductive pillar 740, the second conductive pillar 910, and a part of the substrate 710 between the first conductive pillar 740 and the second conductive pillar 910. Similarly, a second resistance component 940, as shown by a resistor drawn by a dotted line in FIG. 9, is formed by the first conductive pillar 740, the third conductive pillar 920, and a part of the substrate 710 between the first conductive pillar 740 and the third conductive pillar 920. In practice, the second conductive pillar 910, the third conductive pillar 920, the third conductive pad 760, the fifth conductive pad 780, and the fourth conductive pad 770 are connected. Also, the first conductive pad 720, the first conductive pillar 740, and the second conductive pad 730 are connected. Therefore, the capacitance, the first resistance component 930, and the second resistance component 940 are coupled in parallel. The impedance value of the first resistance component 930 is affected by the distance between the first conductive pillar 740 and the second conductive pillar 910, and the impedance value of the second resistance component 940 is affected by the distance between the first conductive pillar 740 and the third conductive pillar 920.

Figure 10:
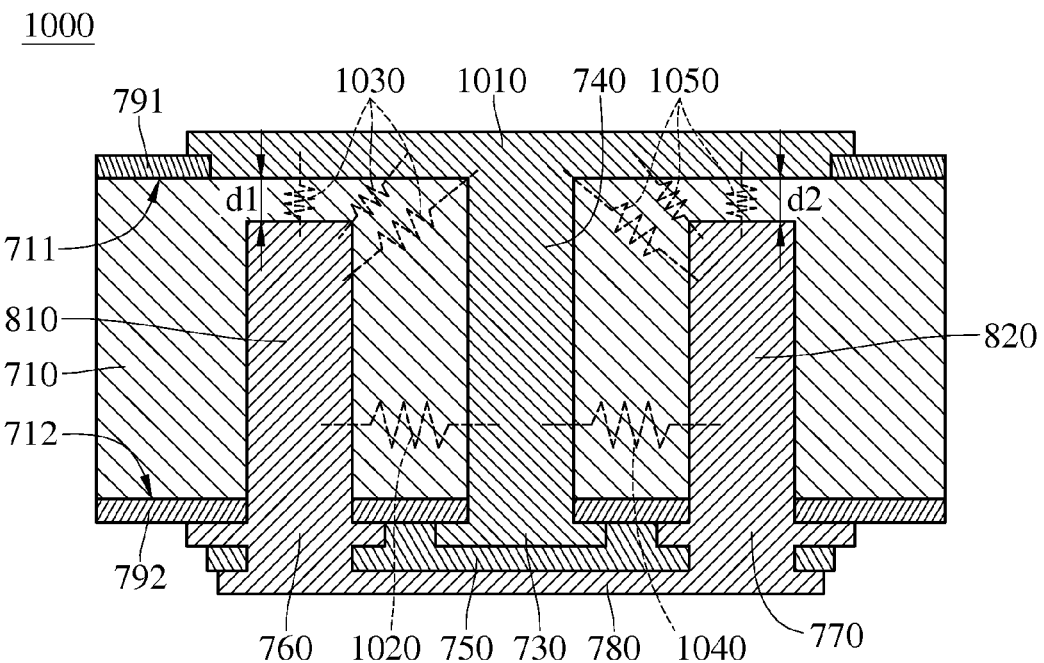
FIG. 10 is a schematic diagram of a tenth embodiment of semiconductor substrate assembly in the disclosure.

FIG. 10 is a schematic diagram of a tenth embodiment of semiconductor substrate assembly in the disclosure. A semiconductor substrate assembly 1000 in this embodiment is similar to the semiconductor substrate assembly 800 in FIG. 8. The semiconductor substrate assembly 1000 includes the substrate 710, the first conductive pad 1010, the second conductive pad 730, the first conductive pillar 740, the dielectric layer 750, the third conductive pad 760, the fourth conductive pad 770, the fifth conductive pad 780, the first isolation layer 791, the second isolation layer 792, the second conductive pillar 810, and the third conductive pillar 820.

The first conductive pad 1010 in this embodiment is extended to a position corresponding to the location of the third conductive pad 760 and the location of the fourth conductive pad 770. The size of the first conductive pad 1010 is larger than the size of first conductive pad 720 in FIG. 8. The first conductive pad 1010 is separated from the second conductive pillar 810 and the third conductive pillar 820. The first conductive pad 1010 and the second conductive pillar 810 have a distance d1 therebetween, and the first conductive pad 1010 and the third conductive pillar 820 have a distance d2 therebetween.

A first resistance component 1020, as shown by a resistor drawn by a dotted line in FIG. 10, is formed by the first conductive pillar 740, the second conductive pillar 810, and a part of the substrate 710 between the first conductive pillar 740 and the second conductive pillar 810. Second resistance components 1030, as shown by a resistor drawn by a dotted line in FIG. 10, are formed by the first conductive pad 1010, the second conductive pillar 810, and a part of the substrate 710 between the first conductive pad 1010 and the second conductive pillar 810. A third resistance component 1040, as shown by a resistor drawn by a dotted line in FIG. 10, is formed by the first conductive pillar 740, the third conductive pillar 820, and a part of the substrate 710 between the first conductive pillar 740 and the third conductive pillar 820. Fourth resistance components 1050, as shown by a resistor drawn by a dotted line in FIG. 10, are formed by the first conductive pad 1010, the third conductive pillar 820, and a part of the substrate 710 between the first conductive pad 1010 and the third conductive pillar 820. The capacitance component, the first resistance component 1020, the second resistance component 1030, the third resistance component 1040, and the fourth resistance component 1050 are coupled in parallel.

The impedance value of the first resistance component 1020 is affected by the distance between the second conductive pillar 810 and the first conductive pillar 740 as well as the height of the second conductive pillar 810. The impedance value of the second resistance component 1030 is affected by the height of the second conductive pillar 810. The impedance value of the third resistance component 1040 is affected by the distance between the third conductive pillar 820 and the first conductive pillar 740 and the height of the third conductive pillar 820. The impedance value of the fourth resistance component 1050 is affected by the height of the third conductive pillar 820.

Figure 11A:
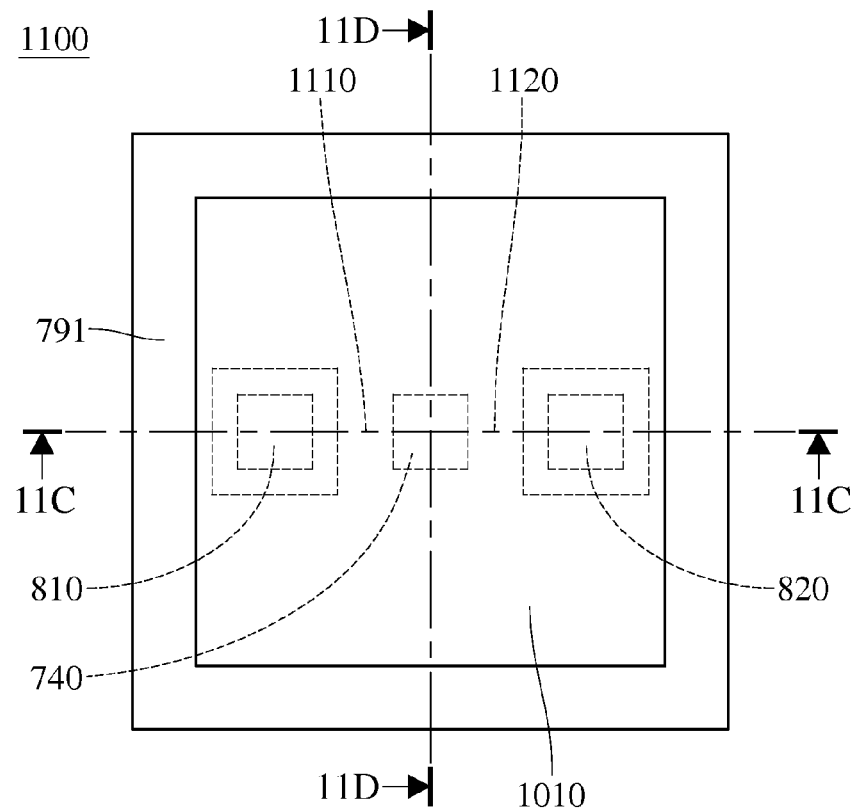
FIG. 11A is a top view of an eleventh embodiment of semiconductor substrate assembly in the disclosure.
Figure 11B:
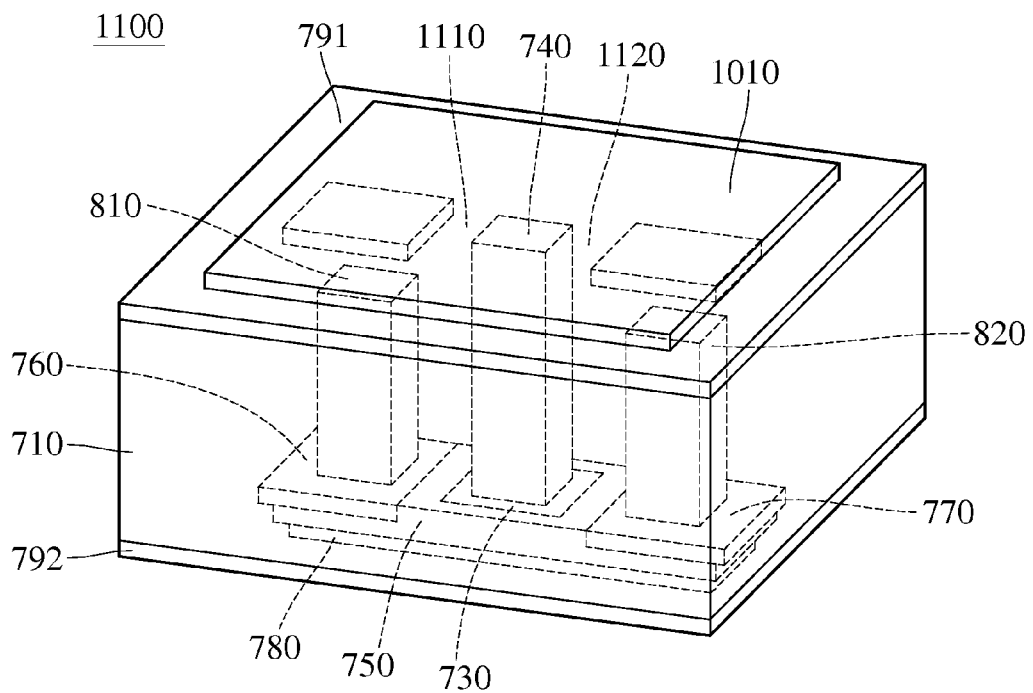
FIG. 11B is a three-dimensional perspective view of the eleventh embodiment of semiconductor substrate assembly in the disclosure.
Figure 11C:
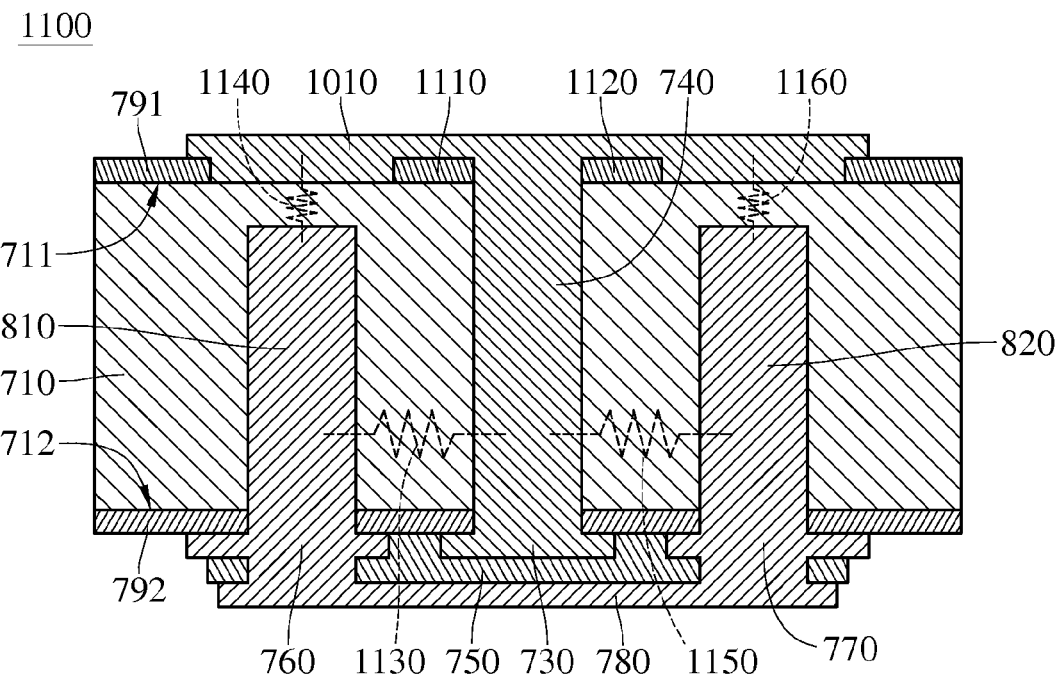
FIG. 11C is a cross-sectional view of the eleventh embodiment of semiconductor substrate assembly in the disclosure along a cross-sectional line 11C-11C shown in FIG. 11A.
Figure 11D:
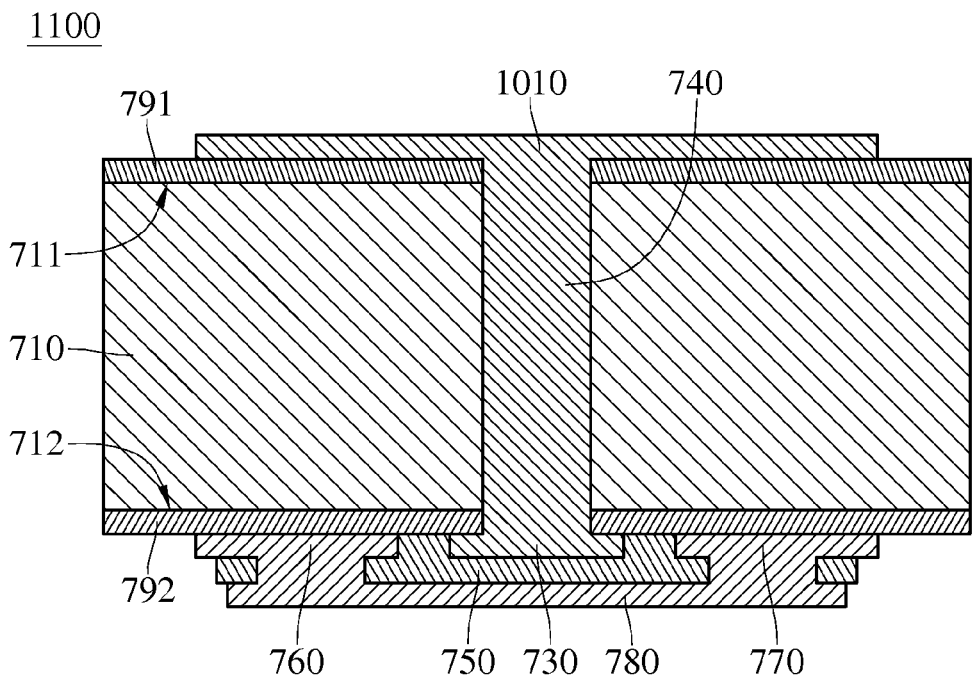
FIG. 11D is a cross-sectional view of the eleventh embodiment of semiconductor substrate assembly in the disclosure along a cross-sectional line 11D-11D shown in FIG. 11A.

Please refer to FIGS. 11A to 11D. FIG. 11A is a top view of an eleventh embodiment of semiconductor substrate assembly in the disclosure, FIG. 11B is a three-dimensional perspective view of the eleventh embodiment of semiconductor substrate assembly in the disclosure, FIG. 11C is a cross-sectional view of the eleventh embodiment of semiconductor substrate assembly in the disclosure along a cross-sectional line 11C-11C shown in FIG. 11A, and FIG. 11D is a cross-sectional view of the eleventh embodiment of semiconductor substrate assembly in the disclosure along a cross-sectional line 11D-11D shown in FIG. 11A. A semiconductor substrate assembly 1100 in this embodiment is similar to the semiconductor substrate assembly 1000 in FIG. 10. Compared with the semiconductor substrate assembly 1000 in FIG. 10, the semiconductor substrate assembly 1100 in FIG. 11C further includes a third isolation layer 1110 and a fourth isolation layer 1120.

The third isolation layer 1110 is located between the substrate 710 and a part of the first conductive pad 1010 and is a part of the first isolation layer 791. The fourth isolation layer 1120 is located between the substrate 710 and a part of the first conductive pad 1010 and is a part of the first isolation layer 791. The third isolation layer 1110 and the fourth isolation layer 1120 are located at two opposite sides of the first conductive pillar 740 along the cross-sectional line 11C-11C respectively.

Since the first conductive pad 1010 covers the third isolation layer 1110 and the fourth isolation layer 1120, the first conductive pad 1010 and a uncovered part of the first isolation layer 791 around the first conductive pad 1010 can be exposed in the top view of the semiconductor substrate assembly 1100 in FIG. 11A.

Moreover, a first resistance component 1130 (as shown by a resistor drawn by a dotted line in FIG. 11C) is formed by the first conductive pillar 740, the second conductive pillar 810, and a part of the substrate 710 between the first conductive pillar 740 and the second conductive pillar 810. Similarly, a second resistance component 1140 (as shown by a resistor drawn by a dotted line in FIG. 11C) is formed by the first conductive pad 1010, the second conductive pillar 810, and a part of the substrate 710 between the first conductive pad 1010 and the second conductive pillar 810. A third resistance component 1150 (as shown by a resistor drawn by a dotted line in FIG. 11C) is formed by the first conductive pillar 740, the third conductive pillar 820, and a part of the substrate 710 between the first conductive pillar 740 and the third conductive pillar 820, and a fourth resistance component 1160 (as shown by a resistor drawn by a dotted line in FIG. 11C) is formed by the first conductive pad 1010, the third conductive pillar 820, and a part of the substrate 710 between the first conductive pad 1010 and the third conductive pillar 820.

In practice, the first conductive pad 1010, the first conductive pillar 740, and the second conductive pad 730 are connected, and the second conductive pillar 810, the third conductive pillar 820, the third conductive pad 760, the fifth conductive pad 780, and the fourth conductive pad 770 are connected. Therefore, the capacitance component, the first resistance component 1130, the second resistance component 1140, the third resistance component 1150, and the fourth resistance component 1160 are coupled in parallel.

The distance between the second conductive pillar 810 and the first conductive pillar 740 as well as the height of the second conductive pillar 810 affects the impedance value of the first resistance component 1130. The height of the second conductive pillar 810 affects the impedance value of the second resistance component 1140. The distance between the third conductive pillar 820 and the first conductive pillar 740 as well as the height of the third conductive pillar 820 affects the impedance value of the third resistance component 1150. The height of the third conductive pillar 820 affects the impedance value of the fourth resistance component 1160.

On the other hand, the cross-sectional view of the semiconductor substrate assembly 1100 in FIG. 11D shows that the first conductive pillar 740 penetrates the substrate 710, sticks out from the upper surface of the substrate 710, and penetrates the first isolation layer 791. The first conductive pad 1010 is located on the first isolation layer 791 and connects to the first conductive pillar 740. The first conductive pillar 740 also sticks out from the lower surface of the substrate 710 and penetrates the second isolation layer 792. While the third conductive pad 760 and the fourth conductive pad 770 respectively connect to the second conductive pillar 810 and the third conductive pillar 820 in FIG. 11C, the third conductive pad 760 and the fourth conductive pad 770 directly covers on the second isolation layer 792 in FIG. 11D.

Although the first isolation layer 791, the third isolation layer 1110, and the fourth isolation layer 1120 in the eleventh embodiment are connected, the first isolation layer 791 can be separated from the third isolation layer 1110 and the fourth isolation layer 1120 in other embodiments.

Figure 11E:
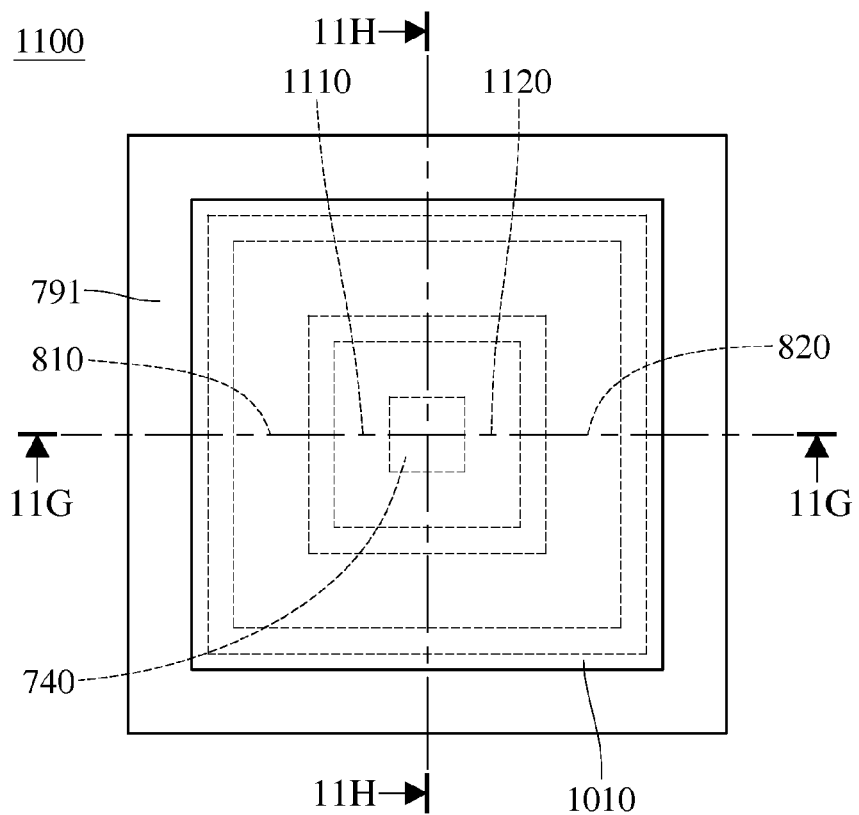
FIG. 11E is a top view of a twelfth embodiment of semiconductor substrate assembly in the disclosure.
Figure 11F:
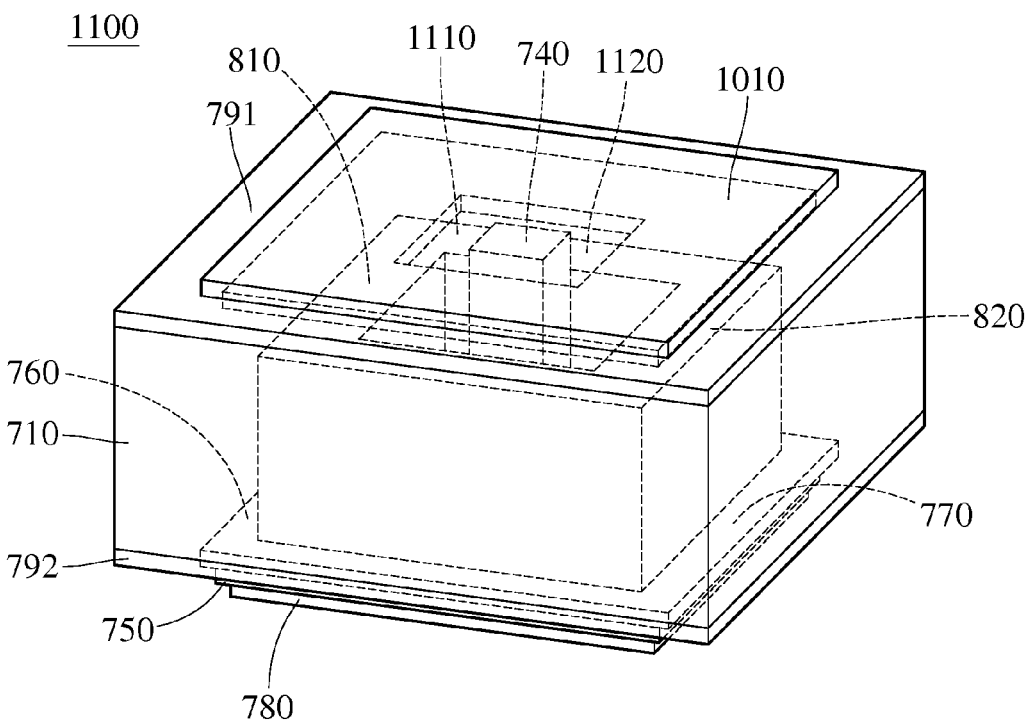
FIG. 11F is a three-dimensional perspective view of the twelfth embodiment of semiconductor substrate assembly in the disclosure.
Figure 11G:
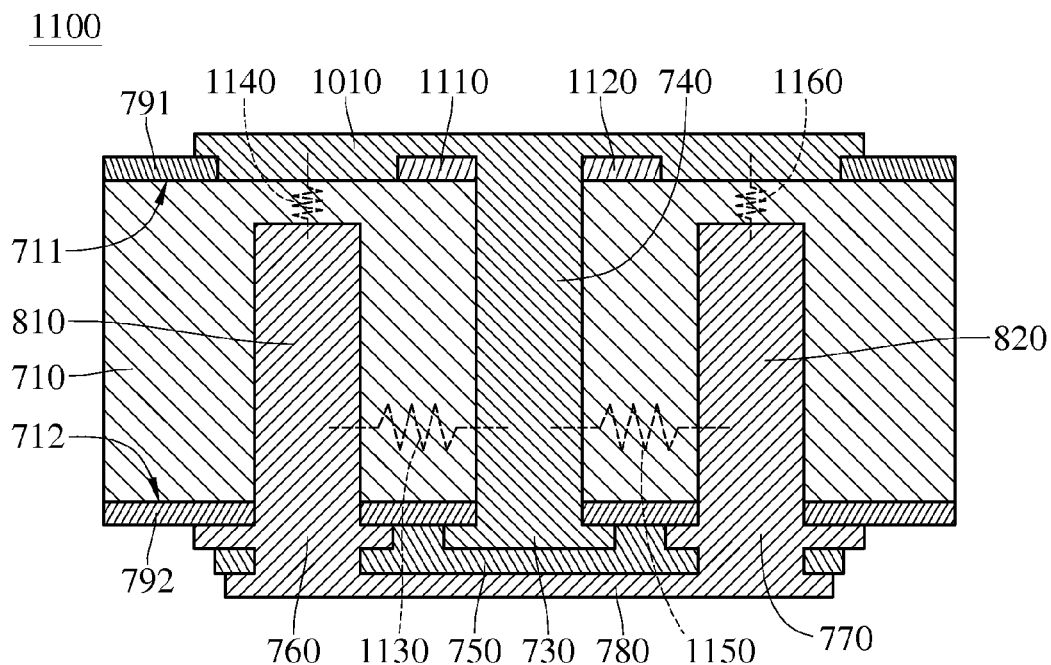
FIG. 11G is a cross-sectional view of the twelfth embodiment of semiconductor substrate assembly in the disclosure along a cross-sectional line 11G-11G shown in FIG. 11E.
Figure 11H:
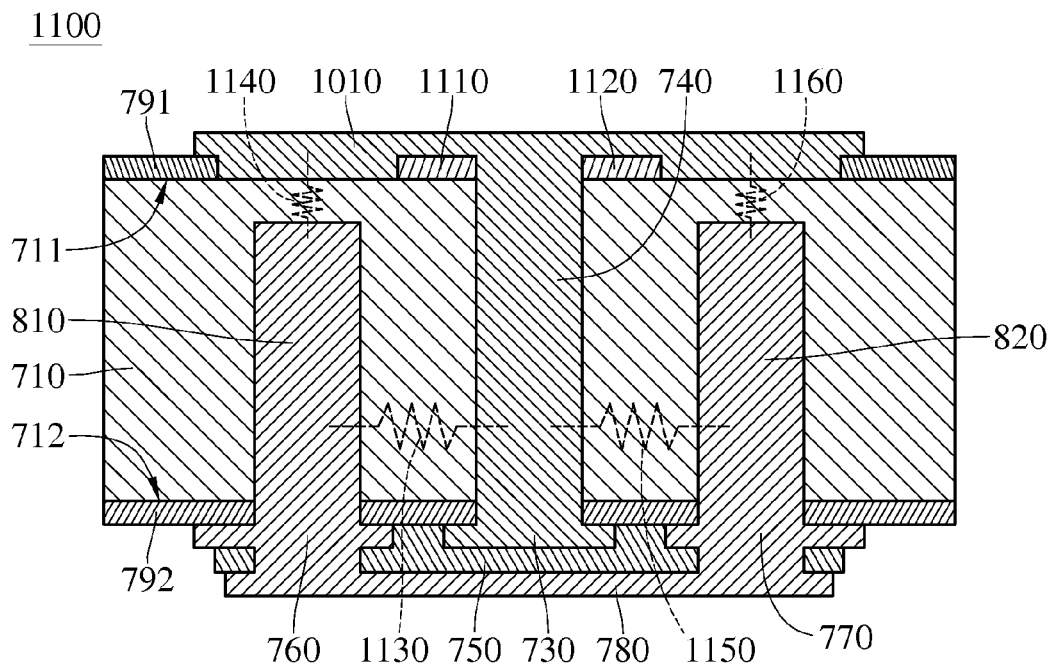
FIG. 11H is a cross-sectional view of the twelfth embodiment of semiconductor substrate assembly in the disclosure along a cross-sectional line 11H-11H shown in FIG. 11E.

Please refer to FIGS. 11E to 11H. FIG. 11E is a top view of a twelfth embodiment of semiconductor substrate assembly in the disclosure, FIG. 11F is a three-dimensional perspective view of the twelfth embodiment of semiconductor substrate assembly in the disclosure, FIG. 11G is a cross-sectional view of the twelfth embodiment of semiconductor substrate assembly in the disclosure along a cross-sectional line 11G-11G shown in FIG. 11E, and FIG. 11H is a cross-sectional view of the twelfth embodiment of semiconductor substrate assembly in the disclosure along a cross-sectional line 11H-11H shown in FIG. 11E. Different from the eleventh embodiment, the first isolation layer 791 is separated from the third isolation layer 1110 and the fourth isolation layer 1120 and the third isolation layer 1110 and the fourth isolation layer 1120 are connected in this embodiment.

The structures along the cross-sectional lines 11G-11G and 11H-11H are the same as those in FIG. 11C and thus, will not be repeated hereinafter. The dispositions of the second conductive pillar 810 and the third conductive pillar 820 are based on those of the third conductive pad 760 and the fourth conductive pad 770, but the disclosure will not be limited thereto. In an embodiment, the second conductive pillar 810 and the third conductive pillar 820 are directly connected to form a tube-shaped conductive pillar surrounding the first conductive pillar 740 when the third conductive pad 760 and the fourth conductive pad 770 form a ring conductive pad, as shown in FIG. 11F. In another embodiment, the second conductive pillar 810 and the third conductive pillar 820 are separated from each other and are respectively at two sides (e.g. two opposite sides) of the first conductive pillar 740 when the third conductive pad 760 and the fourth conductive pad 770 are separated from each other and are respectively at two sides (e.g. two opposite sides) of the second conductive pad 730.

Alternately, the dispositions of the second conductive pillar 810 and the third conductive pillar 820 are independent to those of the third conductive pad 760 and the fourth conductive pad 770. In an embodiment, the second conductive pillar 810 and the third conductive pillar 820 are directly connected to form a tube-shaped conductive pillar surrounding the first conductive pillar 740 when the third conductive pad 760 and the fourth conductive pad 770 are separated from each other and are respectively at two sides (e.g. two opposite sides) of the second conductive pad 730.

On the other hand, no matter if the first isolation layer 791, the third isolation layer 1110, and the fourth isolation layer 1120 connect to each other or not, the semiconductor substrate assembly 1100 can have the same performance.

Figure 12:
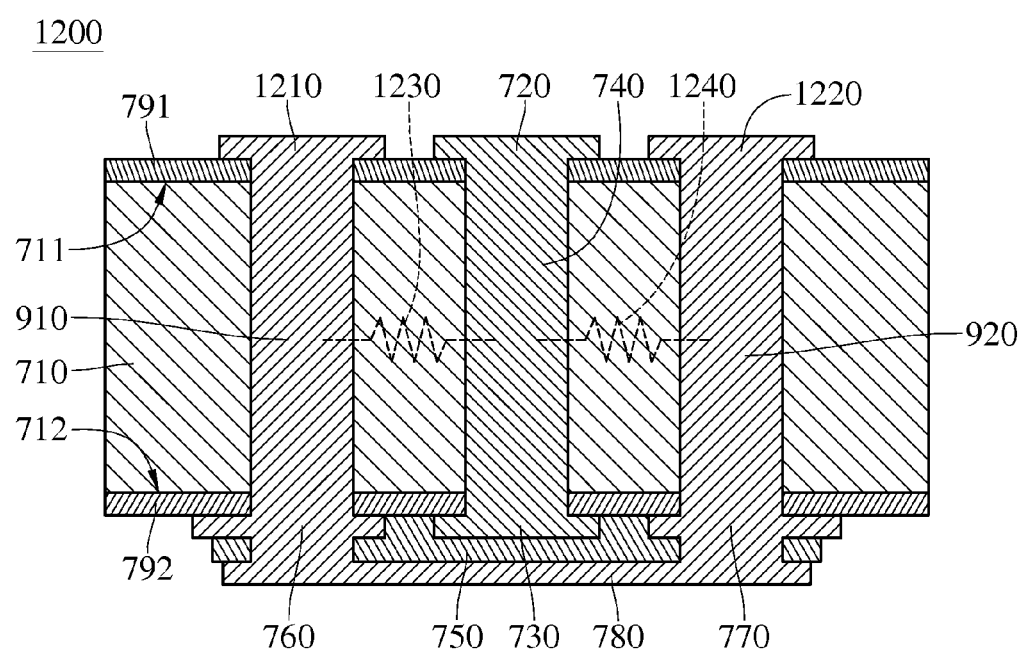
FIG. 12 is a schematic diagram of a thirteenth embodiment of semiconductor substrate assembly in the disclosure.

FIG. 12 is a schematic diagram of a thirteenth embodiment of semiconductor substrate assembly in the disclosure. A semiconductor substrate assembly 1200 in the embodiment is similar to the semiconductor substrate assembly 300 in FIG. 9. The semiconductor substrate assembly 1200 includes not only the substrate 710, the first conductive pad 720, the second conductive pad 730, the first conductive pillar 740, the dielectric layer 750, the third conductive pad 760, the fourth conductive pad 770, the fifth conductive pad 780, the first isolation layer 791, the second isolation layer 792, the second conductive pillar 910, and the third conductive pillar 920 in the semiconductor substrate assembly 300 in FIG. 9 but also a sixth conductive pad 1210 and a seventh conductive pad 1220.

The sixth conductive pad 1210 is located on the first surface 711 of the substrate 710 and touches the second conductive pillar 910, and the location of the sixth conductive pad 1210 corresponds to the location of the third conductive pad 760. The seventh conductive pad 1220 is located on the first surface 711 of the substrate 710 and touches the third conductive pillar 920, and the location of the seventh conductive pad 1220 corresponds to the location of the fourth conductive pad 770. The sixth conductive pad 1210 and the seventh conductive pad 1220 are located at two opposite sides of the first conductive pad 720 respectively.

Furthermore, a first resistance component 1230 (as shown by a resistor drawn by a dotted line in FIG. 12) is formed by the first conductive pillar 740, the second conductive pillar 910, and a part of the substrate 710 between the first conductive pillar 740 and the second conductive pillar 910. Also, a second resistance component 1240 (as shown by a resistor drawn by a dotted line in FIG. 12) is formed by the first conductive pillar 740, the third conductive pillar 920, and a part of the substrate 710 between the first conductive pillar 740 and the third conductive pillar 920. In practice, the sixth conductive pad 1210, the seventh conductive pad 1220, the second conductive pillar 910, the third conductive pillar 920, the third conductive pad 760, the fifth conductive pad 780, and the fourth conductive pad 770 are connected, and the first conductive pad 720, the first conductive pillar 740, and the second conductive pad 730 are connected as well. Therefore, the capacitance component, the first resistance component 1230, and the second resistance component 1240 are coupled in parallel.

Figure 13:
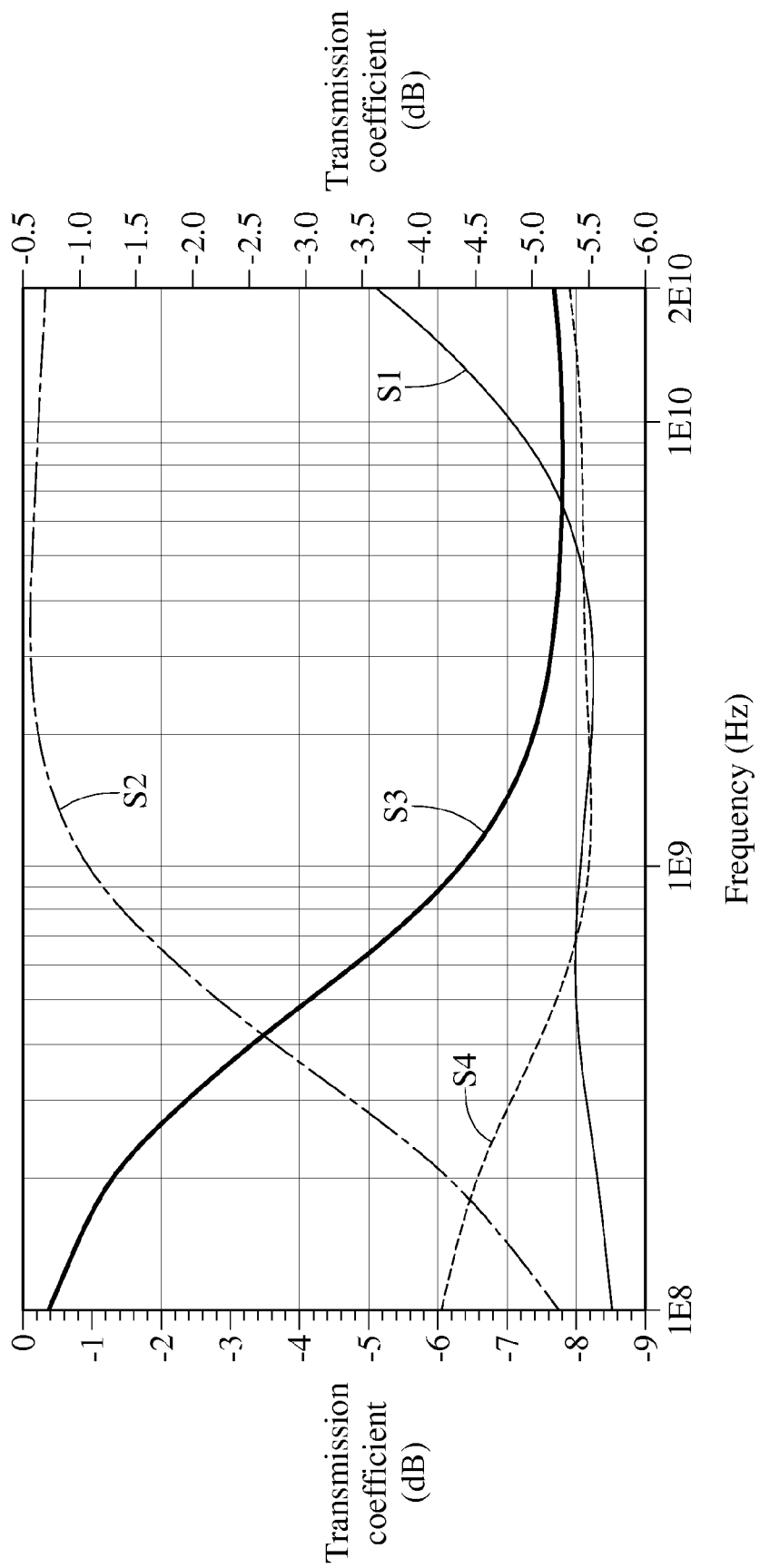
FIG. 13 is a simulation diagram of transmission coefficient versus frequency related to the thirteenth embodiment of semiconductor substrate assembly in the disclosure.

FIG. 13 is a simulation diagram of transmission coefficient versus frequency related to the thirteenth embodiment of semiconductor substrate assembly in the disclosure. The vertical axis indicates transmission coefficients (dB), and the horizontal axis indicates frequencies (Hz). The curve S1 illustrates the characteristics of the semiconductor substrate assembly with resistance components. The curve S2 illustrates the characteristics of the semiconductor substrate assembly with resistance components and capacitance components. The curve S3 illustrates the characteristics of the unequalized semiconductor substrate assembly. The curve S4 illustrates the characteristics of the equalized semiconductor substrate assembly. The waveform of the curve S4 seems smoother, and while indicating high frequencies, the segment of the curve S4 indicates quite the same loss. Accordingly, an equalizer embodied by the semiconductor substrate assembly may have a higher performance.

In the previous embodiments, the height (or the depth) of the conductive pillar, the thickness of the substrate, or the distance between the conductive pillar and the conductive pad affect the impedance value of the resistance component. Moreover, the conductive pad and the conductive pillar mainly perform the transmission of electric signals so that their material is metal, e.g. gold, copper, or the like.

The semiconductor substrate assembly applied in the design of equalizers is generally embodied in a chip. The semiconductor substrate assembly occupies some area of the chip, and such a design of equalizers does not take any feature packaging standard into account. However, the disclosure utilizes the substrate or the cooperation of the substrate and one or more conductive pillars to form the resistance components. Moreover, by designing the thickness of the substrate and the distance between two conductive pillars, the impedance value of the resistance component can be adjusted and be more stable. The disclosure may reduce the manufacture process of equalizers.

The above embodiments using a silicon bulk as the substrate to form the resistance component unnecessarily need to form the resistance component on a chip or a silicon interposer by extra elements but can adjust the impedance value of the equalizer by designing the thickness of the chip or the silicon interposer. Meanwhile, the above embodiments directly form a metallic via as a conductive pillar and adjust the impedance value of the equalizer by designing the distance between two conductive pillars. Therefore, without decreasing the thickness of the chip or silicon interposer, the disclosure can still remain the performance of the equalizer based on the resistance components formed on a silicon bulk. For a resistance component based on a silicon bulk, since temperature does not matter to the impedance value in the front end of the line (FEOL) or the back end of the line (BEOL), the capacitance component can be designed according to actual requirements.

The semiconductor substrate assembly in the disclosure uses the substrate to form the resistance component for the equalizer and further designs the impedance value of the resistance component by adjusting the distance between conductive pillars or by adjusting the thickness (the height of TSV) of the chip. Moreover, the disclosure forms a capacitance component by directly forming the isolation material on the conductive pads of the equalizer. Therefore, the resistance component and the capacitance component are further coupled in parallel in order to form the equalizer.

Since these positive components for the equalizer can be embodied by the IC Backend or the assembly process, the disclosure may have a low cost. In addition, the disclosure is carried out by the back end of the line. Accordingly, the disclosure can be carried out by the packaging standard of the three-dimensional integrated circuit (3D IC) chip. For example, the disclosure is capable of designing the capacitance value of the capacitance component and the resistance value of the resistance component by varying the thickness of the chip, the number of layered chips, and the ratio of depth to width of the TSV.

What is claimed is:

1. A substrate, comprising:
a semiconductor material layer having a first surface and a second surface opposite to the first surface;
a first isolation layer located on the first surface of the semiconductor material layer;
a second isolation layer located on the second surface of the semiconductor material layer;
a first conductive pillar penetrating the semiconductor material layer, the first isolation layer, and the second isolation layer, for being supplied with a first voltage; and
a second conductive pillar penetrating the second isolation layer without penetrating the semiconductor material layer, and connecting from the second surface of the semiconductor material layer to an exposed surface of the second isolation layer, for being supplied with a second voltage.

2. The substrate according to claim 1, wherein a first resistance component is formed between the first conductive pillar and the second conductive pillar in the semiconductor material layer.

3. The substrate according to claim 2, wherein the second conductive pillar is extended into the semiconductor material layer, and a second resistance component is formed between the second conductive pillar and the first conductive pillar in the semiconductor material layer.

4. The substrate according to claim 3, wherein a part of the second conductive pillar is extended to the first surface of the semiconductor material layer.

5. The substrate according to claim 3, wherein the first isolation layer exposes a first part of the first surface, the first part of the first surface overlaps with an extension of the second conductive pillar, the substrate further comprises a first conductive pad located on the first part of the first surface, the first conductive pad electrically connects to the first conductive pillar, and a third resistance component is formed between the first conductive pad and the second conductive pillar in the semiconductor material.

6. The substrate according to claim 5, wherein the first isolation layer further exposes a second part of the first surface, a location of the second part of the first surface overlaps with a location between the first conductive pillar and the second conductive pillar, the substrate further comprises a second conductive pad located on the second part of the first surface, the first conductive pad electrically connects to the first conductive pillar through the second conductive pad, and a fourth resistance component is formed by the second conductive pillar, the first conductive pad, and the second conductive pad in the semiconductor material layer.

7. The substrate according to claim 3, wherein the second conductive pillar is extended into and penetrates the semiconductor material layer, the first isolation layer, and the second isolation layer, and a fifth resistance component is formed by the second conductive pillar and the first conductive pillar in the semiconductor material layer.

8. The substrate according to claim 1, wherein the semiconductor material layer is silicon.

9. A semiconductor substrate assembly, comprising:
a substrate having a first surface and a second surface opposite to the first surface;
a first conductive pad located at a preset location on the first surface of the substrate;
a second conductive pad located at a preset location on the second surface of the substrate, and the preset location of the second conductive pad corresponding to the preset location of the first conductive pad;
a first conductive pillar located in the substrate and electrically connecting to the first conductive pad and the second conductive pad;
a dielectric layer located on the second conductive pad;
a third conductive pad located on the second surface of the substrate;
a fourth conductive pad located on the second surface of the substrate;
a fifth conductive pad located on the dielectric layer, the third conductive pad, and the fourth conductive pad and electrically connecting to the third conductive pad and the fourth conductive pad;
a first isolation layer located on the rest of the first surface of the substrate; and
a second isolation layer located on the rest of the second surface of the substrate.

10. The semiconductor substrate assembly according to claim 9, wherein a first resistance component is formed by the first conductive pillar, the third conductive pad, and a part of the substrate between the first conductive pillar and the third conductive pad, and a second resistance component is formed by the first conductive pillar, the fourth conductive pad, and a part of the substrate between the first conductive pillar and the fourth conductive pad.

11. The semiconductor substrate assembly according to claim 9, further comprising:
a second conductive pillar located in the substrate and touching the third conductive pad; and
a third conductive pillar located in the substrate and touching the fourth conductive pad.

12. The semiconductor substrate assembly according to claim 11, wherein a first resistance component is formed by the first conductive pillar, the second conductive pillar, and a part of the substrate between the first conductive pillar and the second conductive pillar, and a second resistance component is formed by the first conductive pillar, the third conductive pillar, and a part of the substrate between the first conductive pillar and the third conductive pillar.

13. The semiconductor substrate assembly according to claim 11, wherein a length of the second conductive pillar and a length of the third conductive pillar are equal to a length of the first conductive pillar.

14. The semiconductor substrate assembly according to claim 11, wherein a length of the second conductive pillar and a length of the third conductive pillar are different from a length of the first conductive pillar, and the length of the second conductive pillar is equal to the length of the third conductive pillar.

15. The semiconductor substrate assembly according to claim 11, wherein a length of the second conductive pillar and a length of the third conductive pillar are different from a length of the first conductive pillar, and the length of the second conductive pillar is different from the length of the third conductive pillar.

16. The semiconductor substrate assembly according to claim 11, wherein the first conductive pad is extended until a location of the first conductive pad corresponds to a location of the third conductive pad and a location of the fourth conductive pad, and the first conductive pad is respectively apart from the third conductive pad and the fourth conductive pad.

17. The semiconductor substrate assembly according to claim 16, wherein a first resistance component is formed by the first conductive pillar, the second conductive pillar, and a part of the substrate between the first conductive pillar and the second conductive pillar, second resistance components are formed by the first conductive pad, the second conductive pillar, and a part of the substrate between the first conductive pad and the second conductive pillar, a third resistance component is formed by the first conductive pillar, the third conductive pillar, and a part of the substrate between the first conductive pillar and the third conductive pillar, and fourth resistance components are formed by the first conductive pad, the third conductive pillar, a part of the substrate between the first conductive pad and the third conductive pillar.

18. The semiconductor substrate assembly according to claim 11, wherein the second and third conductive pillars form a tube-shaped conductive pillar surrounding the first conductive pillar.

19. The semiconductor substrate assembly according to claim 9, further comprising:
a third isolation layer located between a part of the first conductive pad and the substrate; and
a fourth isolation layer located between a part of the first conductive pad and the substrate,
wherein the third isolation layer and the fourth isolation layer are respectively located at two opposite sides of the first conductive pillar.

20. The semiconductor substrate assembly according to claim 19, wherein a first resistance component is formed by the first conductive pillar, a second conductive pillar, a part of the substrate between the first conductive pillar and the second conductive pillar, a second resistance component is formed by the first conductive pad, the second conductive pillar, and a part of the substrate between the first conductive pad and the second conductive pillar, a third resistance component is formed by the first conductive pillar, a third conductive pillar, and a part of the substrate between the first conductive pillar and the third conductive pillar, and a fourth resistance component is formed by the first conductive pad, the third conductive pillar, and a part of the substrate between the first conductive pad and the third conductive pillar.

21. The semiconductor substrate assembly according to claim 9, further comprising:
a sixth conductive pad located on the first surface of the substrate corresponding to where the third conductive pad is located at, and touching a second conductive pillar; and
a seventh conductive pad located on the first surface of the substrate corresponding to where the fourth conductive pad is located at, and touching a third conductive pillar.

22. The semiconductor substrate assembly according to claim 9, wherein the third and fourth conductive pads form a ring conductive pad.

23. The semiconductor substrate assembly according to claim 9, wherein the third and fourth conductive pads are at two sides of the second conductive pad respectively or a same side of the second conductive pad.

* * * * *